United States Patent
Loy et al.

(10) Patent No.: US 8,992,712 B2
(45) Date of Patent: Mar. 31, 2015

(54) METHOD FOR MANUFACTURING ELECTRONIC DEVICES AND ELECTRONIC DEVICES THEREOF

(71) Applicant: Arizona Board of Regents, a Body Corporate of the State of Arizona Acting for and on Behalf of Arizona State University, Scottsdale, AZ (US)

(72) Inventors: Douglas E. Loy, Chandler, AZ (US); Emmett Howard, Gilbert, AZ (US); Jesmin Haq, Tempe, AZ (US); Nicholas Munizza, Gilbert, AZ (US)

(73) Assignee: Arizona Board of Regents, a Body Corporate of the State of Arizona Acting for and on Behalf of Arizona State University, Scottsdale, AZ (US)

(*) Notice: Subject to any disclaimer, the term of this patent is extended or adjusted under 35 U.S.C. 154(b) by 65 days.

(21) Appl. No.: 13/683,950

(22) Filed: Nov. 21, 2012

(65) Prior Publication Data

US 2014/0065389 A1    Mar. 6, 2014

Related U.S. Application Data

(63) Continuation of application No. PCT/US2011/037207, filed on May 19, 2011.

(60) Provisional application No. 61/383,600, filed on Sep. 16, 2010, provisional application No. 61/347,342, filed on May 21, 2010.

(51) Int. Cl.
*B29C 65/48* (2006.01)
*B32B 37/12* (2006.01)
(Continued)

(52) U.S. Cl.
CPC ............ *H01B 13/00* (2013.01); *H01L 21/2007* (2013.01); *H01L 21/6835* (2013.01);
(Continued)

(58) Field of Classification Search
USPC .......................... 156/247, 248, 701, 711, 712
See application file for complete search history.

(56) References Cited

U.S. PATENT DOCUMENTS 3,089,801 A    5/1963    Tierney et al.
3,684,637 A    8/1972    Andersen et al.
(Continued)

FOREIGN PATENT DOCUMENTS

CN    1118075       3/1996
CN    101231972    7/2007
(Continued)

OTHER PUBLICATIONS

International Search Report and Written Opinion for PCT Application No. PCT/US2011/037226, 11 pages, Feb. 21, 2012.
(Continued)

*Primary Examiner* — Sing P Chan
(74) *Attorney, Agent, or Firm* — Bryan Cave LLP

(57) ABSTRACT

In some embodiments, a method of manufacturing electronic devices including providing a carrier substrate having a first side, a second side, and a first adhesive at the first side; providing a first flexible substrate; and bonding the first flexible substrate to the first side of the carrier substrate. The first adhesive bonds the first flexible substrate to the first side of the carrier substrate. The carrier substrate comprises a mechanism configured to compensate for a deformation of the carrier substrate. Other embodiments are disclosed.

20 Claims, 12 Drawing Sheets

(51) Int. Cl.
  *B32B 38/10* (2006.01)
  *B32B 43/00* (2006.01)
  *H01B 13/00* (2006.01)
  *H01L 21/20* (2006.01)
  *H01L 21/683* (2006.01)
  *H01L 23/498* (2006.01)
  *H01L 27/12* (2006.01)
  *H01L 29/786* (2006.01)
  *H01L 51/00* (2006.01)
  *B32B 7/02* (2006.01)
  *H01L 51/05* (2006.01)

(52) U.S. Cl.
  CPC ...... *H01L23/49833* (2013.01); *H01L 27/1266* (2013.01); *H01L 29/78603* (2013.01); *H01L 29/78636* (2013.01); *H01L 2221/6835* (2013.01); *H01L 2221/68381* (2013.01); *H01L 2924/12044* (2013.01); *H01L 51/003* (2013.01); *H01L 51/0097* (2013.01); *H01L 51/0508* (2013.01); *H01L 2251/5338* (2013.01); *Y02E 10/549* (2013.01); *B32B 7/02* (2013.01); *H01L 2924/0002* (2013.01); *H01L 27/1218* (2013.01)
  USPC .......... 156/247; 156/248; 156/701; 156/711; 156/712

(56) References Cited

U.S. PATENT DOCUMENTS

| | | |
|---|---|---|
| 3,723,635 A | 3/1973 | Smith |
| 4,337,107 A | 6/1982 | Eshleman |
| 4,349,593 A | 9/1982 | Blechstein |
| 4,858,073 A | 8/1989 | Gregory |
| 5,098,772 A | 3/1992 | Af Strom |
| 5,220,488 A | 6/1993 | Denes |
| 5,229,882 A | 7/1993 | Rowland |
| 5,252,383 A * | 10/1993 | Fukutake et al. ............ 428/209 |
| 5,264,063 A | 11/1993 | Martin |
| 5,292,686 A * | 3/1994 | Riley et al. .................... 438/605 |
| 5,453,157 A | 9/1995 | Jeng |
| 5,702,980 A | 12/1997 | Yu et al. |
| 5,714,305 A | 2/1998 | Teng et al. |
| 5,853,511 A | 12/1998 | Fairbanks |
| 5,861,470 A * | 1/1999 | Voss et al. ........................ 528/59 |
| 5,869,150 A | 2/1999 | Iwamoto |
| 5,890,429 A | 4/1999 | Alam et al. |
| 5,916,652 A | 6/1999 | Miner et al. |
| 6,051,169 A * | 4/2000 | Brown et al. ................. 264/40.1 |
| 6,051,508 A | 4/2000 | Takase et al. |
| 6,083,580 A | 7/2000 | Finestone et al. |
| 6,177,163 B1 | 1/2001 | Blok et al. |
| 6,358,832 B1 | 3/2002 | Edelstein et al. |
| 6,482,288 B1 | 11/2002 | Kreckel et al. |
| 6,531,389 B1 | 3/2003 | Shue et al. |
| 6,541,398 B2 | 4/2003 | Grill et al. |
| 6,627,037 B1 | 9/2003 | Kurokawa et al. |
| 6,630,289 B1 | 10/2003 | Kwok et al. |
| 6,632,746 B2 | 10/2003 | Kanegae et al. |
| 6,670,265 B2 | 12/2003 | Wang et al. |
| 6,746,969 B2 | 6/2004 | Shimada et al. |
| 6,752,160 B2 | 6/2004 | Chen |
| 6,808,773 B2 | 10/2004 | Shimamura et al. |
| 6,825,068 B2 | 11/2004 | Denis et al. |
| 7,212,088 B1 | 5/2007 | Norregaard |
| 7,316,942 B2 | 1/2008 | Sarma et al. |
| 7,329,601 B2 | 2/2008 | Miyajima |
| 7,344,993 B2 | 3/2008 | Balasubramaniam et al. |
| 7,385,224 B2 | 6/2008 | Ishii et al. |
| 7,481,901 B2 * | 1/2009 | Toyoda et al. ................. 156/248 |
| 7,538,038 B2 | 5/2009 | Matsushita et al. |
| 7,795,006 B2 * | 9/2010 | Nagino et al. .............. 435/287.2 |
| 7,838,328 B2 | 11/2010 | Isa |
| 7,906,193 B2 | 3/2011 | Yukawa et al. |
| 8,038,820 B2 | 10/2011 | Kim et al. |
| 8,048,251 B2 | 11/2011 | Yamashita et al. |
| 2002/0008839 A1 | 1/2002 | Miyai et al. |
| 2002/0018173 A1 | 2/2002 | Furukawa et al. |
| 2002/0081863 A1 | 6/2002 | Shimada et al. |
| 2003/0072889 A1 | 4/2003 | Abrams |
| 2003/0201465 A1 | 10/2003 | Ryuzaki et al. |
| 2004/0008298 A1 | 1/2004 | Kwok et al. |
| 2004/0110326 A1 | 6/2004 | Forbes et al. |
| 2005/0186801 A1 | 8/2005 | Uno et al. |
| 2005/0221542 A1 | 10/2005 | Yamazaki et al. |
| 2005/0221599 A1 | 10/2005 | Kanegae et al. |
| 2005/0233583 A1 | 10/2005 | Miyajima |
| 2005/0242341 A1 | 11/2005 | Knudson et al. |
| 2006/0017154 A1 | 1/2006 | Eguchi et al. |
| 2006/0019491 A1 | 1/2006 | Soda |
| 2006/0148141 A1 | 7/2006 | Seo et al. |
| 2006/0169485 A1 | 8/2006 | Kawaguchi et al. |
| 2006/0180815 A1 | 8/2006 | Sarma et al. |
| 2006/0192229 A1 | 8/2006 | Kato et al. |
| 2006/0194363 A1 | 8/2006 | Giesberg et al. |
| 2006/0223282 A1 | 10/2006 | Amundson et al. |
| 2007/0241436 A1 | 10/2007 | Ookubo et al. |
| 2008/0038885 A1 | 2/2008 | Lee et al. |
| 2008/0050548 A1 | 2/2008 | Abrams |
| 2008/0090338 A1 | 4/2008 | Tredwell et al. |
| 2008/0105877 A1 | 5/2008 | Yamazaki et al. |
| 2008/0122121 A1 | 5/2008 | Suda et al. |
| 2008/0179594 A1 | 7/2008 | Oh |
| 2009/0004419 A1 | 1/2009 | Cok et al. |
| 2009/0008132 A1 | 1/2009 | Takasawa et al. |
| 2009/0072122 A1 | 3/2009 | Tada et al. |
| 2009/0101903 A1 | 4/2009 | Chen et al. |
| 2009/0202857 A1 | 8/2009 | Kerr et al. |
| 2009/0211791 A1 | 8/2009 | Tredwell et al. |
| 2009/0229874 A1 * | 9/2009 | Katagiri et al. ................ 174/262 |
| 2010/0003512 A1 | 1/2010 | Ookubo et al. |
| 2010/0003513 A1 | 1/2010 | Ookubo et al. |
| 2010/0038023 A1 | 2/2010 | Kho et al. |
| 2010/0059171 A1 | 3/2010 | Chun |
| 2010/0059747 A1 | 3/2010 | Nakayama et al. |
| 2010/0140807 A1 | 6/2010 | Kobayashi et al. |
| 2010/0155694 A1 | 6/2010 | Miller et al. |
| 2010/0219410 A1 | 9/2010 | Godo et al. |
| 2010/0295161 A1 * | 11/2010 | Koduri .......................... 257/676 |
| 2010/0330748 A1 * | 12/2010 | Chu et al. ...................... 438/127 |
| 2011/0064953 A1 | 3/2011 | O'Rourke et al. |
| 2012/0061672 A1 | 3/2012 | O'Rourke et al. |
| 2012/0146713 A1 | 6/2012 | Kim et al. |
| 2012/0168836 A1 | 7/2012 | Lee et al. |

FOREIGN PATENT DOCUMENTS

| | | |
|---|---|---|
| CN | 101288348 | 10/2008 |
| JP | 01-198094 | 9/1989 |
| JP | 07-022795 | 1/1995 |
| JP | 08-148814 | 7/1996 |
| JP | 11-340462 | 10/1999 |
| JP | 2004-311912 | 11/2004 |
| JP | 2005-123576 | 12/2005 |
| JP | 2007-073559 | 3/2007 |
| JP | 2007-123861 | 5/2007 |
| JP | 2007146121 | 6/2007 |
| JP | 2009-71057 | 4/2009 |
| JP | 2010-067849 | 3/2010 |
| JP | 2010-226101 | 10/2010 |
| KR | 20070103050 A | 10/2007 |
| KR | 100810708 B1 | 3/2008 |
| KR | 10-2009-0098033 | 9/2009 |
| KR | 10-2010-0007703 | 1/2010 |
| KR | 10-2010-0043654 | 4/2010 |
| WO | WO9852391 A1 | 11/1998 |
| WO | 2006088564 A1 | 8/2006 |
| WO | 2007083906 | 7/2007 |
| WO | WO2007108659 A1 | 9/2007 |
| WO | WO2008005979 A1 | 1/2008 |
| WO | WO2010051106 A2 | 5/2010 |

(56) References Cited

FOREIGN PATENT DOCUMENTS

| WO | 2010-065542 | 6/2010 |
|---|---|---|
| WO | 2010138811 | 12/2010 |

OTHER PUBLICATIONS

International Search Report and Written Opinion for PCT Application No. PCT/US2011/037207, 11 pages, Feb. 21, 2012.
International Search Report and Written Opinion for PCT Application No. PCT/US2010/036569, 12 pages, Dec. 27, 2012.
International Search Report and Written Opinion for PCT Application No. PCT/US2009/066259, 9 pages, May 5, 2010.
International Search Report and Written Opinion for PCT Application No. PCT/US2009/066111, 8 pages, Oct. 25, 2010.
International Search Report and Written Opinion for PCT Application No. PCT/US2009/066114, 9 pages, Sep. 3, 2010.
International Search Report and Written Opinion from related Int'l Application No. PCT/US2012/032388 dated Dec. 10, 2012, 10 pages.
International Search Report and Written Opinion from related Int'l Application No. PCT/US2013/058284.
International Search Report and Written Opinion from related Int'l Application No. PCT/US2013/058293.
International Search Report and Written Opinion from related Int'l Application No. PCT/US2012/066833.

* cited by examiner

METHOD FOR MANUFACTURING ELECTRONIC DEVICES AND ELECTRONIC DEVICES THEREOF

CROSS-REFERENCE TO RELATED APPLICATIONS

This application is a continuation application based on International Patent Application Serial No. PCT/US2011/037207, filed May 19, 2011. International Patent Application Serial No. PCT/US2011/037207 claims the benefit of U.S. Provisional Application Ser. No. 61/383,600, filed Sep. 16, 2010, and U.S. Provisional Application Ser. No. 61/347,342, filed May 21, 2010. U.S. Provisional Application Ser. No. 61/383,600, U.S. Provisional Application Ser. No. 61/347,342, International Patent Application Serial No. PCT/US2011/037207, and International Patent Application Serial No. PCT/US2010/036569, filed May 28, 2010, are incorporated herein by reference in their entirety.

STATEMENT REGARDING FEDERALLY SPONSORED RESEARCH OR DEVELOPMENT

This invention was made with government support under W911NF-04-2-0005 awarded by the Army Research Office. The government has certain rights in the invention.

FIELD OF THE INVENTION

This invention relates generally to processing electronic devices on flexible substrates, and relates more particularly to bonding flexible substrates to two sides of a carrier substrate, and the electronic devices therefrom.

DESCRIPTION OF THE BACKGROUND

Flexible electronics have attracted significant academic and commercial attention in recent years as a result of their potential to revolutionize the interaction between humans and electronic devices. This paradigm shifting technology provides the opportunity to create energy-efficient products that are lightweight, ultrathin, and rugged. It provides further opportunities to create very large area electronics with the ability to flex, curve, conform, and roll. Currently, flexible electronics technology is being actively developed for applications in flexible flat panel display manufacturing, flexible semiconductor manufacturing, flexible electronic manufacturing/processing, flexible solar manufacturing, flexible sensor manufacturing. As a result, a rapidly increasing demand exists for high performance, highly compact and portable devices and methods of high-throughput manufacturing for such devices.

Despite high demand, there are major technological barriers that currently hinder the widespread integration of flexible electronics. One of the most fundamental challenges is how to process systems on a malleable substrate. In order to address this challenge, bonding a flexible substrate to a rigid carrier is a method that allows flexible substrates to be processed in standard toolsets with little or no modification. However, a need exists in the art to develop a process that accommodates thermal expansion and stress mismatches when bonding flexible substrates to carriers.

BRIEF DESCRIPTION OF THE DRAWINGS

To facilitate further description of the embodiments, the following drawings are provided in which.

Figure 1:
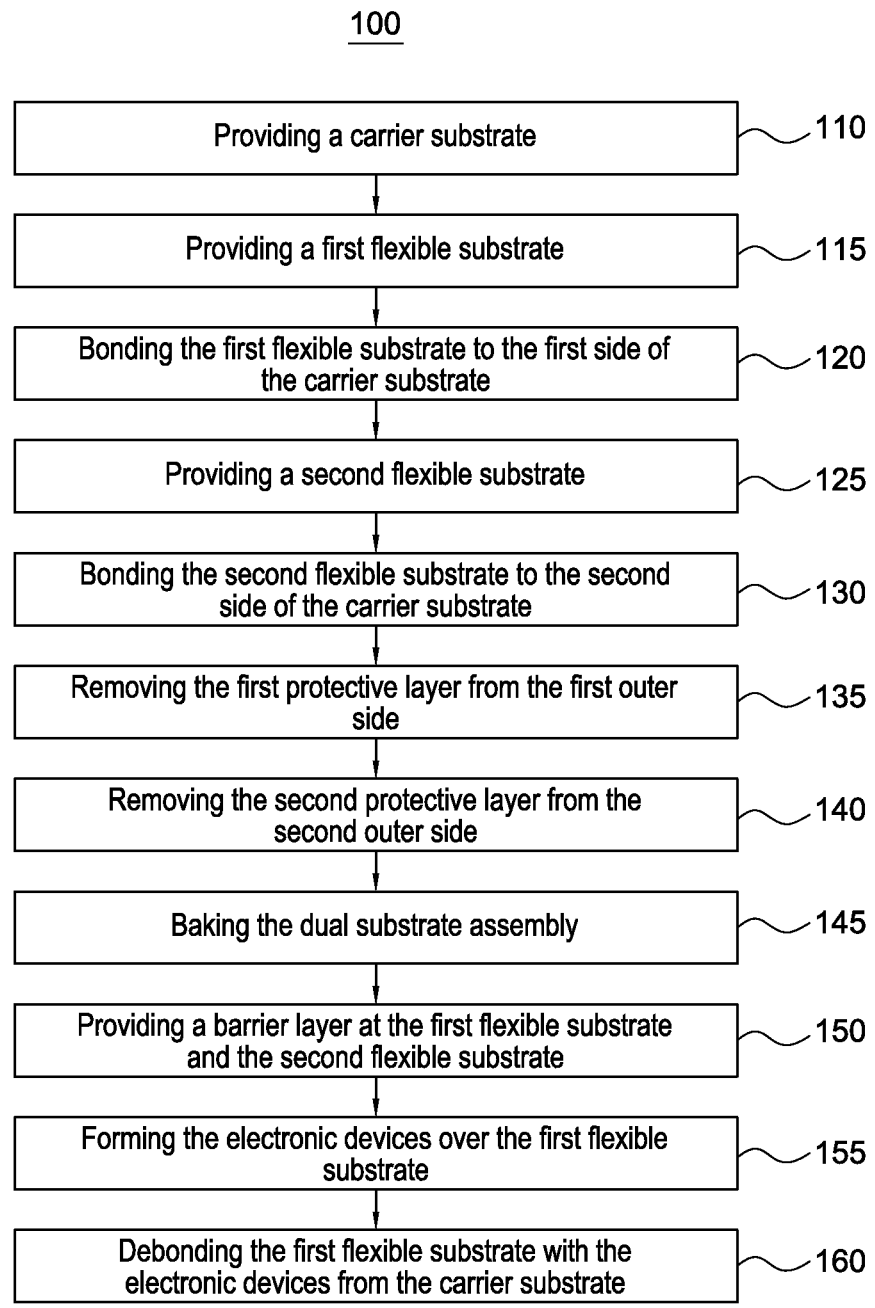
FIG. 1 illustrates an example method of manufacturing electronic devices, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "bonded" or "coupled," and the like does not mean that the bonding or coupling, etc. in question is or is not removable. For example, the recitation of a flexible substrate being bonded to a carrier substrate does not mean that the flexible substrate cannot be removed (readily or otherwise) from, or that it is permanently connected to, the carrier substrate.

DETAILED DESCRIPTION OF EXAMPLES OF EMBODIMENTS

Some embodiments include a method of manufacturing electronic devices. The method can comprise: providing a carrier substrate having a first side, a second side, and a first adhesive at the first side; providing a first flexible substrate; and bonding the first flexible substrate to the first side of the carrier substrate. In these embodiments, the first adhesive bonds the first flexible substrate to the first side of the carrier substrate, and the carrier substrate comprises a mechanism configured to compensate for a deformation of the carrier substrate.

Other embodiments include a method of manufacturing electronic devices can comprise: providing a carrier substrate having a first side and a second side; providing a first flexible substrate having a first outer side and a first carrier side; providing a second flexible substrate having a second outer side and a second carrier side; providing a first adhesive; providing a second adhesive; applying a first protective layer to the first outer side; bonding the first carrier side to the first side of the carrier substrate, wherein the first adhesive bonds the first carrier side to the first side of the carrier substrate; curing the first adhesive; applying a second protective layer to the second outer side; bonding the second carrier side to the second side of the carrier substrate, wherein the second adhesive bonds the second carrier side to the second side of the carrier substrate; curing the second adhesive, removing the first protective layer from the first outer side; removing the second protective layer from the second outer side; baking the first flexible substrate, the second flexible substrate, and the carrier substrate; and providing a barrier layer at one or more of the first flexible substrate or the second flexible substrate.

Further embodiments include a structure. The structure can comprise a carrier substrate having a first side and a second side; a first flexible substrate having a first carrier side; and a second flexible substrate having a second carrier side. In these embodiments, the first side of the carrier substrate is bonded to the first carrier side, and the second side of the carrier substrate is bonded to the second carrier side. Meanwhile, the first flexible substrate and the second flexible substrate comprise a thermoplastic polymer.

The term "bowing" as used herein means the curvature of a substrate about a median plane, which is parallel to the top and bottom sides, or major surfaces of the substrate. The term "warping" as used herein means the linear displacement of the surface of a substrate with respect to a z-axis, which is perpendicular to the top and bottom sides, or major surfaces of the substrate. The term "distortion" as used herein means the displacement of a substrate in-plane (i.e., the x-y plane, which is parallel to the top and bottom sides, or major surfaces of the substrate). For example, distortion could include shrinkage in the x-y plane of a substrate and/or expansion in the x-y plane of the substrate. The term "deformation" as used herein means a change in the configuration of a substrate resulting from the effect of at least one of bowing, warping, or distortion.

The term "CTE matched material" as used herein means a material that has a coefficient of thermal expansion (CTE) which differs from the CTE of a reference material by less than about 20 percent (%). In different embodiments, the CTEs differ by less than about 10%, 5%, 3%, or 1%. As used herein, "polish" can mean to lap and polish a surface or to only lap the surface.

The term "flexible substrate" as used herein means a free-standing substrate comprising a flexible material which readily adapts its shape.

Turning to the figures, FIG. 1 illustrates an example of method 100 of manufacturing electronic devices, according to a first embodiment. In the same or different embodiments, method 100 can be considered a method of bonding flexible substrates to dual sides of a carrier substrate to mitigate stress and thermal expansion differences between the flexible substrates and the carrier substrate. Method 100 is merely exemplary and is not limited to the embodiments presented herein. Method 100 can be employed in many different embodiments or examples not specifically depicted or described herein.

Figure 2:
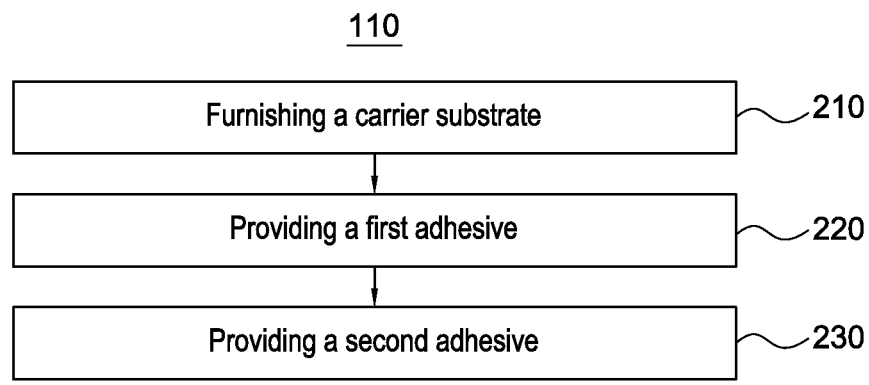
FIG. 2 illustrates an example method of providing a carrier substrate, according to the first embodiment.

In some embodiments, method 100 comprises procedure 110 of providing a carrier substrate. In some embodiments, procedure 110 can comprise various processes. FIG. 2 is a flow chart illustrating procedure 110 of providing a carrier substrate, according to the first embodiment.

Referring to FIG. 2, in some embodiments, procedure 110 comprises process 210 of furnishing a carrier substrate. In many examples, the carrier substrate can comprise a first side and a second side. In many further examples, the carrier substrate can comprise a first side, a second side, and a first adhesive at the first side. In other examples, the carrier substrate can further comprise a mechanism configured to compensate for deformation of the carrier substrate. In some embodiments of procedure 110, the mechanism is provided as part of procedure 125, described below, instead of being part of procedure 110. In various examples, the carrier substrate also can comprise a second adhesive at the second side. In some embodiments of procedure 110, either or both of the first adhesive and the second adhesive are provided at the carrier substrate according to processes 220 and 230, described below, instead of being part of process 210.

In many examples, the carrier substrate can be rigid. In these or other examples, the increase in rigidity of the carrier substrate provided by increasing the thickness of the carrier substrate can be balanced against the increase in cost and weight provided by increasing the thickness of the carrier substrate. In many examples, the carrier substrate can be a 6, 8, 12, or 18 inch wafer or panel. In the same or different examples, increasing the radius of the wafer can help to maintain the planarity of the carrier substrate. In some examples, the carrier substrate can be a wafer or a panel of approximately 370 millimeters (mm) by 470 mm.

In some examples, the carrier substrate can comprise a material having a glass transition point greater than or equal to approximately 300 degrees Celsius (° C.). In the same or different examples, the carrier substrate can have a thickness greater than or equal to approximately 0.5 mm and less than or equal to approximately 2.0 mm. In various examples, the carrier substrate can be a material comprising at least one of the following: alumina ($Al_2O_3$), silicon, low CTE glass, steel, sapphire, barium borosilicate, soda lime silicate, alkali silicate, or a first material that is CTE matched to a second material comprising at least one of polyethylene naphthalate (PEN), polyethylene terephthalate (PET), polyethersulfone (PES), polyimide, polycarbonate, cyclic olefin copolymer, or liquid crystal polymer. In some examples, where the carrier substrate is bonded to another material, the CTE of the carrier substrate can be matched to the CTE of the second material to reduce the formation of stress between the carrier substrate and the second material. In some embodiments, the carrier substrate can be of high purity to minimize ion leaching from the carrier substrate that could degrade ultimate electronic device performance.

In more specific examples, the carrier substrate could comprise sapphire with a thickness between approximately 0.7 mm and approximately 1.1 mm. In other examples, the carrier substrate also could comprise 96% alumina with a thickness between approximately 0.7 mm and approximately 1.1 mm. In different examples, the thickness of the 96% alumina can be approximately 2.0 mm. In another example, the carrier substrate could be a single crystal silicon wafer with a thickness of at least approximately 0.65 mm. In still a further examples, the carrier substrate can comprise stainless steel with a thickness of at least approximately 0.5 mm. In some examples, the carrier substrate is slightly larger than the flexible substrate.

In some examples, at least one side of the carrier substrate can comprise a single micrometer roughness. In the same or different examples, roughening the surface of the carrier substrate to a single micrometer roughness can improve the adhesive wetting properties of the carrier substrate. In many examples, minimizing the surface roughness of the carrier substrate above the single micrometer can help to prevent high spots from forming later during method 100 (FIG. 1). In various examples, etching a side of the carrier substrate can provide a single micrometer roughness. In some examples, etching a side of the carrier substrate can be performed using a Frost etching and/or a Plasma Enhanced etching. In further examples, etching a side of the carrier substrate can be performed using a wet etching.

In some examples, the carrier substrate can be designed to minimize stress development during method 100 (FIG. 1). In many embodiments, minimizing the initial stress in the carrier substrate and matching the CTE of the carrier substrate to the flexible substrate, described below, can help to minimize stress development. In further examples, minimizing stress can help to reduce the development of deformation of the carrier substrate during method 100 (FIG. 1) in the event of a vacuum failure of a vacuum chuck.

In some examples, the first adhesive and the second adhesive can comprise similar or identical materials while in other examples, the first adhesive and the second adhesive can comprise different materials. In various examples, each of the first adhesive and the second adhesive can comprise a cross-linking adhesive and/or can have a thickness greater than or equal to approximately 3 micrometers (μm) and less than or equal to approximately 50 μm. In further examples, the first adhesive and the second adhesive neither comprise the cross-linking adhesive nor have a thickness greater than or equal to approximately 3 μm and less than or equal to approximately 50 μm. Meanwhile, in other examples, the first adhesive and the second adhesive can comprise a pressure sensitive adhesive and/or can have a thickness greater than or equal to approximately 3 μm and less than or equal to approximately 250 μm. In various examples, the first adhesive or the second adhesive neither comprise a pressure sensitive adhesive nor have a thickness greater than or equal to approximately 3 μm and less than or equal to approximately 250 μm. In many examples, the first adhesive and/or the second adhesive can comprise a "semiconductor grade" adhesive to avoid particle formation in a clean room environment, impurities that might contaminate the thin-film transistors (TFTs), and outgassing in vacuum processing tools.

Figure 3:
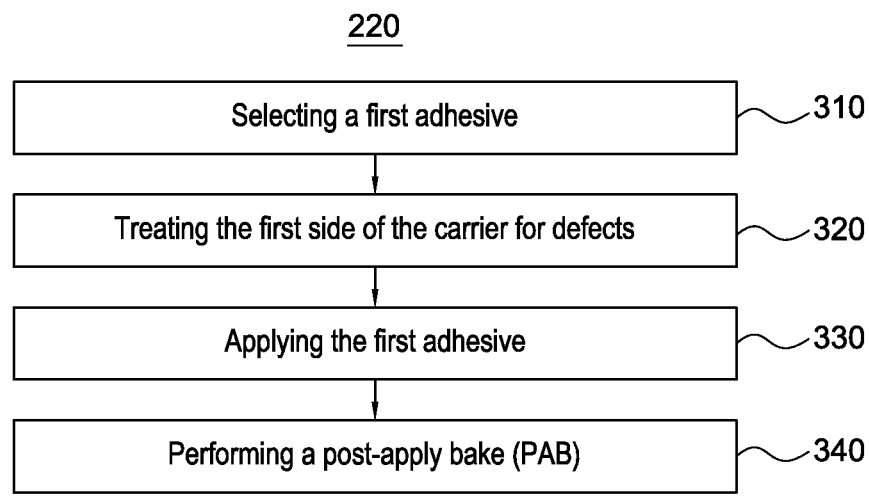
FIG. 3 illustrates an example method of providing a first adhesive, according to the first embodiment.

In some embodiments, procedure 110 can comprise process 220 of providing a first adhesive, as illustrated in FIG. 2. In other embodiments, process 220 can instead be performed as process 430 (FIG. 4) of procedure 115, as described below. Meanwhile, some embodiments of method 100 can comprise performing both process 220 and process 430. In various embodiments, process 220 can comprise activity 310 (FIG. 3) of selecting a first adhesive. In many examples, the first adhesive of activity 310 can comprise at least one of the embodiments of the first adhesive and/or the second adhesive, where applicable, of procedure 110 above. FIG. 3 is a flow chart illustrating activity 310 of selecting a first adhesive, according to the first embodiment.

In some embodiments, after activity 310 in FIG. 3, process 220 can comprise activity 320 of treating the first side of the carrier for defects. In many examples, the first side of the carrier can be treated with an oxygen plasma ash. In the same or different examples, the oxygen plasma ash treatment can be applied for six minutes. In various examples, treating the side of the carrier within approximately 48 hours of applying the first adhesive can help to remove carbon deposits from the first side of the carrier in order to provide improved wetting of the first adhesive to the first side of the carrier.

In various embodiments, process 220 also can comprise activity 330 of applying the first adhesive. In some examples, activity 330 of applying the first adhesive can comprise one or more of spin-coating, spray-coating, extrusion-coating, preform laminating, slot die coating, screen laminating, and/or screen printing. In many examples, activity 330 of applying the first adhesive can comprise applying the first adhesive to the first side of the carrier substrate.

Returning to FIG. 2, in some embodiments, procedure 110 can comprise process 230 of providing a second adhesive. In some embodiments, process 230 can be similar to process 220. Accordingly, in various embodiments, process 230 can comprise performing activity 310 (FIG. 3) for a second adhesive. In some embodiments, process 230 can comprise performing activity 320 (FIG. 3) for the second side of the carrier. In further embodiments, process 230 can comprise performing activity 330 (FIG. 3) for the second adhesive and for the second side of the carrier substrate. In many examples, the embodiments of activities 310, 320, and 330 (FIG. 3) of process 230 can comprise the same embodiments of activities 310, 320, and 330 of process 220. For example, like the first adhesive of process 220, the second adhesive of process 230 can comprise at least one of the embodiments of the first adhesive and/or the second adhesive, where applicable, of procedure 110 above. In some embodiments, instead of performing process 230 as part of procedure 110, process 230 can be performed as process 630 of procedure 125, as described below. Meanwhile, some embodiments of method 100 can comprise performing both process 220 and process 630.

Figure 4:
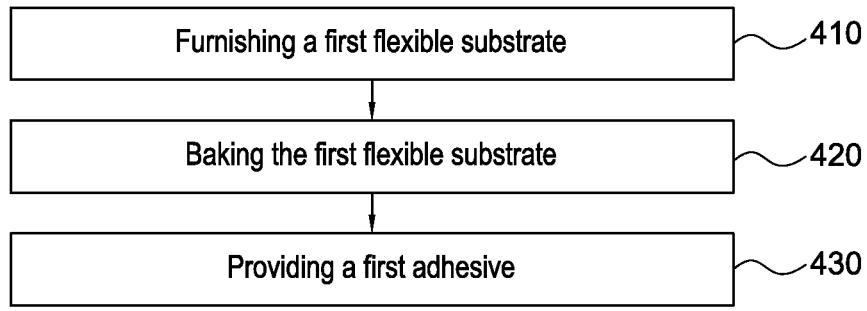
FIG. 4 illustrates an example method of providing a first flexible substrate, according to the first embodiment.

Referring back to FIG. 1, in many embodiments, method 100 comprises procedure 115 of providing a first flexible substrate. FIG. 4 is a flow chart illustrating procedure 115 of providing a first flexible substrate, according to the first embodiment.

In some embodiments, procedure 115 can comprise process 410 of furnishing a first flexible substrate, as illustrated in FIG. 4. In some examples, the first flexible substrate can comprise a first outer side. In other examples, the first flexible substrate can comprise a first carrier side. In many examples, the first flexible substrate can comprise both a first outer side and a first carrier side. In some examples, process 410 of furnishing a first flexible substrate can comprise cutting a sheet of plastic substrate from a roll of the plastic material using a paper cutter or a pair of ceramic scissors. In various examples, after cutting the plastic substrate, the cut sheet can be blown clean with a nitrogen gun. In some embodiments of procedure 115, either or both of the cutting and blowing activities can be part of process 420, described below, instead of being part of process 410. In many examples, the first flexible substrate can be cut to a size twenty percent (20%) larger than the final size to be bonded according to procedure 120 below. Cutting the first flexible substrate 20% larger than the final size can compensate for shrinkage of the first flexible substrate that can occur during process 420 as described below.

In many examples, the first flexible substrate can comprise a material. In various examples, the first flexible substrate can comprise a plastic substrate. Plastic substrates are typically optically transparent and thus can be compatible with both bottom emitting and top emitting organic light emitting diode (OLED) device architectures. In various further examples, the first flexible substrate can comprise a thermoplastic polymer substrate. In some examples, the first flexible substrate can comprise polyethylene naphthalate (PEN), polyethylene terephthalate (PET), polyethersulfone (PES), polyimide, polycarbonate, cyclic olefin copolymer, or liquid crystal polymer. In the same or different examples, the first flexible substrate has a thickness greater than or equal to approximately 3 micrometers and less than or equal to approximately 100 micrometers. For example, the first flexible substrate can comprise a PEN substrate from DuPont Teijin Films of Tokyo, Japan, sold under the tradename "planarized Teonex® Q65." In other examples, the first flexible substrate comprises a metal foil. Metal foil substrates can offer an advantages of allowing higher processing temperatures. In many examples, plastic substrates can have a lower cost potential compared to metal foil substrates.

In many examples, potential considerations when selecting a first flexible substrate can comprise dimensional stability, thermal stability, clarity, solvent resistance, permeability of oxygen and moisture, surface roughness, and inertness to process chemicals. In some examples, the first flexible substrate could have at least one of: a glass transition temperature that is compatible with device process temperatures so that the first flexible substrate is thermally and dimensionally stable, a low moisture uptake, a CTE of less than 20 parts per million per degree Celsius (ppm/° C.), good surface properties, compatibility with TFT process chemistry, and an optical transmission in the visible range exceeding 87%.

In some examples, the first flexible substrate can have a coating at one or more sides of the first flexible substrate. In some examples, the coating can improve the scratch resistance of the first flexible substrate and/or help prevent outgassing or oligomer crystallization on the surface of the substrate. In the same or different examples, the coating can planarize the side of the first flexible substrate over which it is located. In further examples, the coating can help decrease distortion. In some examples, the coating is located only at one side of the first flexible substrate. In other examples, the coating is at both sides of the first flexible substrate. In various embodiments, the first flexible substrate can be pre-planarized. In some examples, the first flexible substrate can be electrically insulated.

In some embodiments, procedure 115 can comprise activity 420 of baking the first flexible substrate, as illustrated in FIG. 4. Baking the first flexible substrate can help release oligomers and other chemicals in the flexible substrate that could potentially leach out later during method 100 (FIG. 1). In many examples, procedure 410 and/or 420 can be performed before procedure 220 and/or 230.

In some examples, activity 420 of baking the first flexible substrate can comprise vacuum baking the first flexible substrate. In various examples, the temperature in an oven containing the first flexible substrate can be ramped up over approximately two to three hours from room temperature to approximately 160° C. to approximately 200° C. The first flexible substrate can be baked for one hour at approximately 160° C. to approximately 200° C. and at a pressure of approximately one milliTorr (mTorr) to approximately one Torr. Then, the temperature in the oven can be lowered to between approximately 90° C. to approximately 115° C. over 0.5 to 3 hours, and the first flexible substrate can be baked for approximately eight more hours at the lower temperature. In further examples, other baking processes also can be used. In some embodiments, after the baking process is complete, the first flexible substrate can be wiped clean of any residues or chemicals that were baked off.

In some embodiments, procedure 115 can comprise process 430 of providing a first adhesive, as illustrated in FIG. 4. In some embodiments, process 430 can be similar to process 220. Accordingly, in various examples, process 430 can comprise performing activity 310 (FIG. 3) for a first adhesive. In some examples, process 430 can comprise performing activity 320 (FIG. 3) for the first side of the carrier. In further embodiments, process 430 can comprise performing activity 330 (FIG. 3) for the first adhesive and for the first carrier side of the first flexible substrate. In many examples, the embodiments of activities 310, 320, and 330 (FIG. 3) of process 430 can comprise the same embodiments of activities 310, 320, and 330 (FIG. 3) of process 220. For example, like the first adhesive of process 220, the first adhesive of process 430 can comprise at least one of the embodiments of the first adhesive and/or the second adhesive, where applicable, of procedure 110 above.

Figure 5:
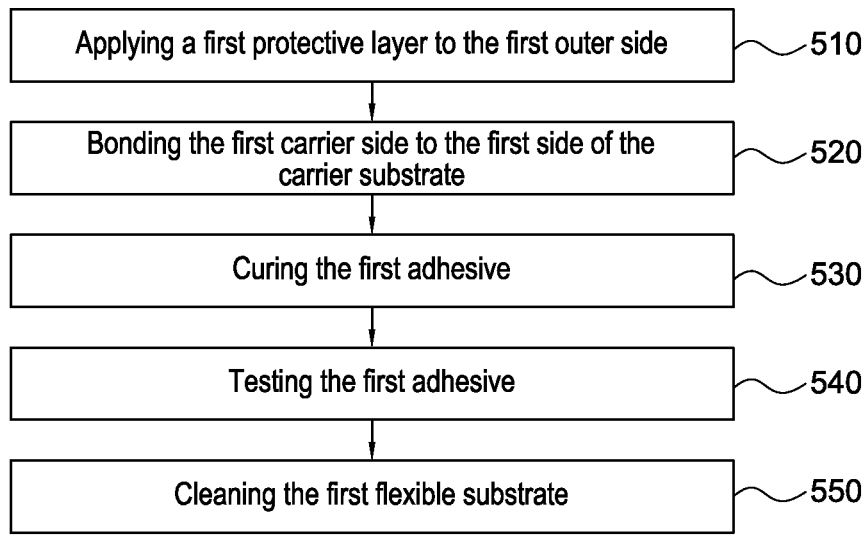
FIG. 5 illustrates an example method of bonding the first flexible substrate to the first side of the carrier substrate, according to the first embodiment.

Referring back to FIG. 1, in some embodiments, method 100 comprises procedure 120 of bonding the first flexible substrate to the first side of the carrier substrate. FIG. 5 is a flow chart illustrating procedure 120 of bonding the first flexible substrate to the first side of the carrier substrate, according to the first embodiment. In many examples, procedure 120 of bonding the first flexible substrate to the first side of the carrier substrate can limit the bowing of the bonded system due to CTE mismatches between the first flexible substrate and the carrier substrate. The CTE of most available flexible substrate materials is often significantly greater than the CTE for many readily available rigid inorganic carrier substrates. Bowing during processing can lead to wafer handling problems in processing equipment and/or delamination of the flexible substrate from the carrier. In many examples, procedure 115 can be performed prior to procedure 120.

In many examples, the first adhesive bonds the first carrier side to the first side of the carrier substrate. In some examples, the first adhesive can form a bond between the first carrier side and the first side of the carrier substrate, where the bond is strong enough to withstand the full range of TFT fabrication conditions experienced during photolithography, thermal vacuum, reactive plasma, wet acid/base, and solvent processes. In the same or different examples, the first adhesive can form a bond between the first carrier side and the first side of the carrier substrate, where the bond can be easily separated when desired. In still other examples, the first adhesive can initially behave like a liquid, but can later behave like a solid upon bonding the first flexible substrate and the carrier substrate to sustain stresses of the joint and to provide sufficient shear strength between the first flexible substrate and the carrier substrate. In further embodiments, the first adhesive also can fix the position of the first flexible substrate during processing to minimize distortion.

In some embodiments, procedure 120 can comprise process 510 of applying a first protective layer to the first outer side, as illustrated in FIG. 5. In various examples, process 510 of applying a first protective layer to the first outer side can comprise applying a first protective layer to all of the first outer side. In other examples, process 510 of applying a first protective layer to the first outer side can comprise applying a first protective layer to a part of the first outer side. In some examples, process 510 is omitted so that no protective layer is applied to the first outer side, or the first flexible substrate is furnished with the protective layer.

In some examples, the first protective layer prevents scratches on the first flexible substrate. In other examples, the first protective layer prevents adhesive from covering at least a portion of the flexible substrate and thus, reduces defects. In many examples, the first protective layer comprises blue low tack tape (e.g. from Semiconductor Equipment Corporation, part number 18133-7.50) or mylar. In the same or different examples, the first protective layer can be approximately 25 µm to approximately 100 µm thick. In some examples, the first protective material can be approximately 70 µm thick. In many examples, the first protective material can be applied by rolling the first protective material onto the outer surface of the first flexible substrate using a roller to remove air bubbles between the first protective layer and the first flexible substrate.

In some embodiments, procedure 120 continues with process 520 of bonding the first carrier side to the first side of the carrier substrate, as illustrated in FIG. 5. In some examples, process 520 of bonding the first carrier side to the first side of the carrier substrate comprises roll pressing the first carrier side of the first flexible substrate to the first side of the carrier substrate. In the same or different examples, the roll pressing can occur at a pressure greater than or equal to approximately 5 pounds per square inch (psi) and less than or equal to approximately 60 psi, at a temperature greater than or equal to approximately 30° C. and less than or equal to approximately 100° C., and/or at a feed rate greater than or equal to approximately 0.25 meters per minute and less than or equal to approximately one meter per minute. In the other examples, the roll pressing can occur under other conditions.

In some embodiments, procedure 120 can comprise process 530 of curing the first adhesive. In various examples, process 530 of curing the first adhesive can comprise providing ultraviolet radiation and/or providing thermal radiation.

In many examples, providing ultraviolet radiation can comprise exposing the first adhesive to UV light for approximately 15 to 25 seconds at room temperature. In some examples, the adhesive can be cured with UV light in the UV light range of approximately 200 nm (nanometers) to approximately 450 nm and with an intensity of approximately 75 milliWatts per square centimeter (mW/cm2). In the same or different examples, a Dymax 2000-EC UV Curing Flood Lamp, manufactured by Dymax Corporation of Torrington, Conn., can be used to cure the first adhesive.

In some examples, providing thermal radiation can comprise vacuum baking the first adhesive. In various examples, the temperature in an oven containing the flexible substrate can be ramped up over approximately two to three hours from room temperature to approximately 160° C. to approximately 190° C. The first adhesive can be baked for 50 minutes to 120 minutes at approximately 180° C. and at a pressure of approximately one mTorr to approximately one Torr. Then, the temperature in the oven can be lowered to between approximately 90° C. to approximately 115° C., and the first adhesive can be baked for approximately seven more hours to approximately nine more hours at the lower temperature. Other baking processes also can be used. In many examples, after the baking process is complete, the first flexible substrate is cleaned and placed in an oven at approximately 90° C. to 110° C. for a minimum of approximately two hours.

In some embodiments, procedure 120 can comprise process 550 of cleaning the first flexible substrate. In many examples, process 550 of cleaning the first flexible substrate comprises applying a detergent to at least the first flexible substrate, performing a quick-dump-rinse (QDR), and performing a spin-rinse-dry (SRD). In other examples, process 550 of cleaning the first flexible substrate comprises applying a detergent to at least the first flexible substrate, performing a quick-dump-rinse (QDR), and performing a isopropyl alcohol (IPA) dry. In further examples, process 550 can comprise performing an ultrasonic clean in a solution of ammonium hydroxide (NH$_4$OH) and water (H$_2$O) at a ratio of 100 to 1.

Figure 6:
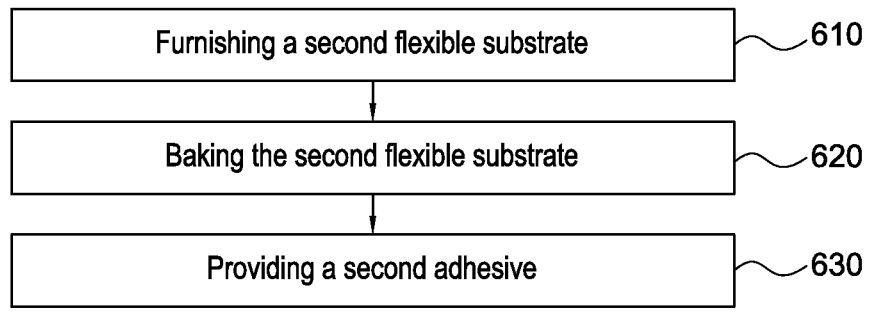
FIG. 6 illustrates an example method of providing a second flexible substrate, according to the first embodiment.

Referring back to FIG. 1, in many embodiments, method 100 comprises procedure 125 of providing a second flexible substrate. FIG. 6 is a flow chart illustrating procedure 125 of providing a second flexible substrate, according to the first embodiment. In many examples, the mechanism configured to compensate for a deformation of the carrier substrate, as described in process 210 above, comprises the second flexible substrate and the second adhesive.

In some embodiments, procedure 125 can comprise process 610 of furnishing a second flexible substrate, as illustrated in FIG. 6. In some examples, the second flexible substrate can comprise a second outer side. In other examples, the second flexible substrate can comprise a second carrier side. In many examples, the second flexible substrate can comprise both a second outer side and a second carrier side. In some examples, process 610 of furnishing a second flexible substrate can comprise cutting a sheet of plastic substrate from a roll of the plastic material using a paper cutter or a pair of ceramic scissors. In various examples, after cutting the plastic substrate, the cut sheet can be blown clean with a nitrogen gun. In some examples of procedure 125, either or both of the cutting and blowing activities can be part of a process 620, described below, instead of being part of process 610. In many examples, the second flexible substrate can be cut to a size 20% larger than the final size to be bonded according to procedure 130 described below. Cutting the first flexible substrate 20% larger than the final size can compensate for shrinkage of the first flexible substrate that can occur during process 620 as described below.

In many examples, the second flexible substrate can comprise a material. In various examples, the second flexible substrate can comprise a plastic substrate. In various further examples, the second flexible substrate can comprise a thermoplastic polymer substrate. In some examples, the second flexible substrate can comprise polyethylene naphthalate (PEN), polyethylene terephthalate (PET), polyethersulfone (PES), polyimide, polycarbonate, cyclic olefin copolymer, or liquid crystal polymer. In the same or different examples, the second flexible substrate has a thickness greater than 3 micrometers and less than 100 micrometers. For example, the second flexible substrate can comprise a PEN substrate from DuPont Teijin Films of Tokyo, Japan, sold under the tradename "planarized Teonex® Q65." In other examples, the second flexible substrate comprise a metal foil.

In many examples, potential considerations when selecting a second flexible substrate can comprise dimensional stability, thermal stability, clarity, solvent resistance, permeability of oxygen and moisture, surface roughness, and inertness to process chemicals. In some examples, the second flexible substrate could have at least one of: a glass transition temperature that is compatible with device process temperatures so that the second flexible substrate is thermally and dimensionally stable, a low moisture uptake, a CTE of less than 20 parts per million per degree Celsius (ppm/° C.), good surface properties, compatibility with TFT process chemistry, and an optical transmission in the visible range exceeding 87%.

In some examples, the second flexible substrate can have a coating at one or more sides of the second flexible substrate. In some examples, the coating can improve the scratch resistance of the second flexible substrate and/or help prevent outgassing or oligomer crystallization on the surface of the substrate. In the same or different examples, the coating can planarize the side of the second flexible substrate over which it is located. In further examples, the coating can help decrease distortion. In some examples, the coating is located only at one or both sides of the second flexible substrate. In various examples, the second flexible substrate can be pre-planarized. In some examples, the second flexible substrate can be electrically insulated.

In some embodiments, procedure 125 can comprise activity 620 of baking the second flexible substrate, as illustrated in FIG. 6. Baking the second flexible substrate can help release oligomers and other chemicals in the flexible substrate that could potentially leach out later during method 100 (FIG. 1). In many examples, procedure 610 and/or 620 can be performed before procedure 220 and/or 230.

In some examples, activity 620 of baking the second flexible substrate can comprise vacuum baking the second flexible substrate. In various examples, the temperature in an oven containing the second flexible substrate can be ramped up over approximately two to three hours from room temperature to approximately 160° C. to approximately 200° C. The second flexible substrate can be baked for one hour at approximately 160° C. to approximately 200° C. and at a pressure of approximately one milliTorr (mTorr) to approximately one Ton. Then, the temperature in the oven can be lowered to between approximately 90° C. to approximately 115° C. over 0.5 to 3 hours, and the second flexible substrate can be baked for approximately eight more hours at the lower temperature. In further examples, other baking processes also can be used. In some examples, after the baking process is complete, the second flexible substrate can be wiped clean of any residues or chemicals that were baked off.

In some embodiments, procedure 125 can comprise process 630 of providing a second adhesive, as illustrated in FIG. 4. In some examples, process 630 can be similar to process 230 (FIGS. 2 and 3). Accordingly, in various examples, process 630 can comprise performing activity 310 (FIG. 3) for a second adhesive. In some examples, process 630 can comprise performing activity 320 (FIG. 3) for the second side of the carrier. In further examples, process 630 can comprise performing activity 330 (FIG. 3) for the second adhesive and for the second carrier side of the second flexible substrate. In many examples, the examples of activities 310, 320, and 330 (FIG. 3) of process 630 can comprise the same examples of activities 310, 320, and 330 (FIG. 3) of process 220. For example, like the first adhesive of process 220, the first adhesive of process 630 can comprise at least one of the examples of the first adhesive and/or the second adhesive, where applicable, of procedure 110 above.

Figure 7:
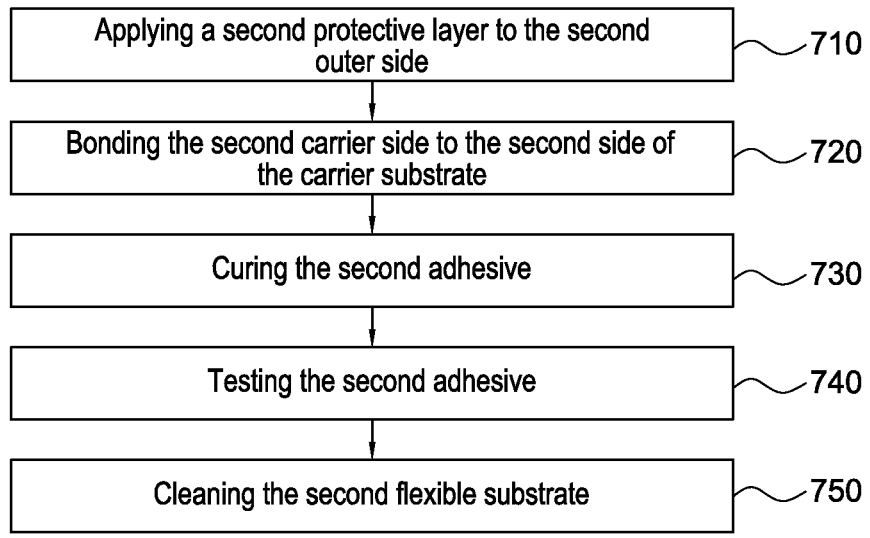
FIG. 7 illustrates an example method of bonding the second flexible substrate to the second side of the carrier substrate, according to the first embodiment.

Referring back to FIG. 1, in some embodiments, method 100 comprises procedure 130 of bonding the second flexible substrate to the second side of the carrier substrate. FIG. 7 is a flow chart illustrating procedure 130 of bonding the second flexible substrate to the second side of the carrier substrate, according to the first embodiment. In many examples, procedure 130 of bonding the second flexible substrate to the second side of the carrier substrate can limit the bowing of the bonded system due to CTE mismatches between the second flexible substrate and the carrier substrate. In many examples, procedure 125 can be performed prior to procedure 130.

In many examples, the second adhesive bonds the second carrier side to the second side of the carrier substrate. In some examples, the second adhesive can form a bond between the second carrier side and the second side of the carrier substrate, where the bond is strong enough to withstand the full range of TFT fabrication conditions experienced during photolithography, thermal vacuum, reactive plasma, wet acid/base, and solvent processes. In other examples, the second adhesive can form a bond between the second carrier side and the second side of the carrier substrate, where the bond can be easily separated when desired. In still other examples, the second adhesive can initially behave like a liquid, but can later behave like a solid upon bonding the second flexible substrate and the carrier substrate to sustain stress of the joint and to provide sufficient shear strength between the second flexible substrate and the carrier substrate. In further examples, the second adhesive also can fix the position of the second flexible substrate during processing to minimize distortion.

In some embodiments, procedure 130 can comprise process 710 of applying a second protective layer to the second outer side, as illustrated in FIG. 7. In various examples, process 710 of applying a second protective layer to the second outer side can comprise applying a second protective layer to all of the second outer side. In other examples, process 710 of applying a second protective layer to the second outer side can comprise applying a second protective layer to a part of the second outer side. In some examples, process 710 is omitted so that no protective layer is applied to the second outer side, or the second flexible substrate is furnished with the protective layer.

In some examples, the second protective layer prevents scratches on the second flexible substrate. In other examples, the second protective layer prevents adhesive from covering at least a portion of the second flexible substrate and thus, reduces defects. In many examples, the second protective layer comprises blue low tack tape (e.g. from Semiconductor Equipment Corporation, part number 18133-7.50) or mylar. In the same or different examples, the second protective layer can be approximately 25 µm to approximately 100 µm thick. In some examples, the second protective material can be approximately 70 µm thick. In many examples, the second protective material can be applied by rolling the second protective material onto the outer surface of the second flexible substrate using a roller to remove air bubbles between the second protective layer and the second flexible substrate.

In some embodiments, procedure 130 continues with process 720 of bonding the second carrier side to the second side of the carrier substrate, as illustrated in FIG. 7. In some examples, process 720 of bonding the second carrier side to the second side of the carrier substrate comprises roll pressing the second carrier side of the second flexible substrate to the second side of the carrier substrate. In the same or different examples, the roll pressing can occur at a pressure greater than or equal to approximately 5 pounds per square inch (psi) and less than or equal to approximately 60 psi, at a temperature greater than or equal to approximately 30° C. and less than or equal to approximately 100° C., and/or at a feed rate greater than or equal to approximately 0.25 meters per minute and less than or equal to approximately one meter per minute. In other examples, the roll pressing can occur at other conditions.

In some embodiments, procedure 130 can comprise process 730 of curing the second adhesive. In various examples, process 730 of curing the second adhesive can comprise providing ultraviolet radiation and/or providing thermal radiation.

In many examples, providing ultraviolet radiation can comprise exposing the second adhesive to UV light for approximately 15 to 25 seconds at room temperature. In some examples, the second adhesive can be cured with UV light in the UV light range of approximately 200 nm (nanometers) to approximately 450 nm and with an intensity of approximately 75 milliWatts per square centimeter (mW/cm2). In the same or different examples, a Dymax 2000-EC UV Curing Flood Lamp, manufactured by Dymax Corporation of Torrington, Conn., can be used to cure the second adhesive.

In some examples, providing thermal radiation can comprise vacuum baking the second adhesive. In various examples, the temperature in an oven containing the flexible substrate can be ramped up over approximately two to three hours from room temperature to approximately 160° C. to approximately 190° C. The second adhesive can be baked for 50 minutes to 120 minutes at approximately 180° C. and at a pressure of approximately one mTorr to approximately one Ton. Then, the temperature in the oven can be lowered to between approximately 90° C. to approximately 115° C., and the second adhesive can be baked for approximately seven more hours to approximately nine more hours at the lower temperature. Other baking processes also can be used. In many examples, after the baking process is complete, the second flexible substrate is cleaned and placed in an oven at approximately 90° C. to 110° C. for a minimum of approximately two hours.

In some embodiments, procedure 130 can comprise process 750 of cleaning the second flexible substrate. In many examples, process 750 of cleaning the second flexible substrate comprises applying a detergent to at least the second flexible substrate, performing a quick-dump-rinse (QDR), and performing a spin-rinse-dry (SRD). In other examples, process 750 of cleaning the first flexible substrate comprises applying a detergent to at least the first flexible substrate, performing a quick-dump-rinse (QDR), and performing a isopropyl alcohol (IPA) dry. In further examples, process 750 can comprise performing an ultrasonic clean in a solution of ammonium hydroxide ($NH_4OH$) and water ($H_2O$) at a ratio of 100 to 1.

Returning to FIGS. 1, 4, and 6, in some examples of processes 115 and 125, the first flexible substrate can comprise a material and the second flexible substrate comprise the same material. In further examples of processes 115 and 125, each of the first flexible substrate and the second flexible substrate can comprise at least one of a thermoplastic polymer and/or a thickness greater than 3 micrometers and less than 100 micrometers. In the same or different examples of processes 115 and 125, the thermoplastic polymer comprises one or more of polyethylene naphthalate, polyethylene terephthalate, polyethersulfone, polyimide, polycarbonate, cyclic olefin copolymer, and/or liquid crystal polymer. In various examples of processes 115 and 125, treating the first side of the carrier substrate to remove defects and treating the second side of the carrier substrate to remove defects can occur approximately simultaneously with each other.

Returning to FIGS. 1, 5, and 7, in some examples of processes 120 and 130, both curing the first adhesive and curing the second adhesive can comprise at least the same one of providing ultraviolet radiation or providing thermal radiation. In some examples of processes 120 and 130, each of the first protective layer and the second protective layer can comprise tape.

Referring back to FIG. 1, in some embodiments, method 100 can comprise procedure 135 of removing the first protective layer from the first outer side. In many examples, the protective layers can be removed slowly using tweezers. In many examples, during the removal process, the first protective material is kept as flat as possible to avoid de-bonding the first flexible substrate from the carrier substrate. In other examples, the first protective material can be released using UV light. In these examples, the first protective material loses its tack by undergoing a UV light exposure. In other examples, the first protective material can be peeled slowly from the first flexible substrate.

Referring back to FIG. 1, in some embodiments, method 100 can comprise procedure 140 of removing the second protective layer from the second outer side. In many examples, the protective layers can be removed slowly using tweezers. In many examples, during the removal process, the second protective material is kept as flat as possible to avoid de-bonding the second flexible substrate from the carrier substrate. In other examples, the second protective material can be released using UV light. In these examples, the second protective material loses its tack by undergoing a UV light exposure. In other examples, the second protective material can be peeled slowly from the second flexible substrate. In some embodiments of method 100, procedure 140 is omitted.

Referring back to FIG. 1, in some embodiments, method 100 can comprise procedure 145 of baking the first flexible substrate, the second flexible substrate, and the carrier substrate (referenced hereinafter as the "dual substrate assembly"). In many examples, procedure 145 can comprise baking the dual substrate assembly, the first adhesive, and the second adhesive. In some examples, procedure 145 can help stabilize the flexible substrates and the adhesives. In some examples, where the first adhesive and/or the second adhesive contains a solvent, procedure 145 can remove residual solvent.

In various examples, the temperature in an oven containing the dual substrate assembly can be ramped up over approximately two to three hours from room temperature to approximately 160° C. to approximately 190° C. The dual substrate assembly can be baked for 30 minutes to 120 minutes at approximately 180° C. and at a pressure of approximately one mTorr to approximately one Ton. Then, the temperature in the oven can be lowered to between approximately 90° C. to approximately 115° C., and the dual substrate assembly can be baked for approximately seven more hours to approximately nine more hours at the lower temperature. Other baking processes also can be used. After the baking process is complete, the first flexible substrate and the second flexible substrate can be cleaned and placed in an oven at approximately 90° C. to 110° C. for a minimum of approximately two hours.

In other examples, the first flexible substrate can comprise polyethylene terephthalate, and the baking the dual substrate assembly occurs at a condition comprising at least one of: a vacuum, a pressure of approximately 30 milliTorr, a temperature of approximately 150° C., or a time of approximately 1 hour. In still other examples, the first flexible substrate can comprise polyethylene naphthalate, and the baking the dual substrate assembly occurs at a condition comprising at least one of: a vacuum, a pressure of approximately 30 milliTorr, a temperature of approximately 200° C., or a time of approximately 1 hour. In many examples, the baking can be done using a vacuum bake oven. In various examples, the baking can be done using a Yamato Oven 3 or 4.

Referring back to FIG. 1, in some embodiments, method 100 can comprise procedure 150 of providing a barrier layer at the first flexible substrate and/or the second flexible substrate. In some examples, the barrier layer can be applied over or to at least a portion of only one of the first flexible substrate or the second flexible substrate. In other examples, the barrier layer is applied to over or to at least a portion of both the first flexible substrate and the second flexible substrate. In the same or different examples, the barrier layer can be applied over or to at least a portion of one of the carrier substrate, the first adhesive layer, or the second adhesive layer. In many examples, the barrier layer can comprise at least silicon nitride (SiN) or silicon dioxide (SiO$_2$). In various examples, the barrier layer can comprise a moisture diffusion barrier to minimize moisture uptake and expansion of the first flexible substrate and the second flexible substrate when exposed to moisture. TFT performance can degrade due to interaction with moisture and/or oxygen. Metal foil substrates offer an advantage of being inherently impermeable such that, in some examples, a barrier layer can be unnecessary with metal foil substrates. In some examples, the barrier layer can be baked for five minutes. In further examples, the barrier layer can be 300 nanometers (nm) thick.

Referring back to FIG. 1, in some embodiments, method 100 can comprise procedure 149 of performing a post apply bake (PAB) of the dual substrate assembly. In many examples, procedure 149 can further comprise baking the dual substrate assembly, the first adhesive, and the second adhesive. In many examples, procedure 149 can be performed immediately prior to procedure 150. In the same or different examples, procedure 149 can help to thermally stabilize the first flexible substrate and/or the second flexible substrate and remove excess moisture from the first flexible substrate and/or the second flexible substrate that either substrate may have absorbed between procedure 145 and procedure 150. Accordingly, in some examples, where there is a significant time interval between the performance of procedure 145 and procedure 150, performing procedure 149 can be increasingly helpful. Procedure 149 can mitigate shrinkage and/or curling of the first flexible substrate and/or the second flexible substrate during procedure 150.

In various examples, the temperature in an oven for the PAB of procedure 149 can be ramped up over approximately one to three hours from approximately 100° C. to approximately 200° C. at a rate of between approximately 0.5 to 1.5° C. per minute. The dual substrate assembly can be baked for approximately 60 minutes at approximately 200° C. and at a pressure of approximately one mTorr to approximately one Torr. Other baking processes also can be used. After the baking process is complete, the first flexible substrate and the second flexible substrate can be cleaned.

In many embodiments, the intrinsic stresses and differences between the CTE of the carrier substrate and the flexible substrates can be minimized to prevent undesired bowing of the dual substrate assembly. For example, in many embodiments, the curvature of the dual substrate assembly can be a function of the material properties of the first flexible substrate, the second flexible substrate, and the carrier substrate, such as Elastic modulus (E), Poisson ratio (v), thickness, and strain mismatch ($\epsilon$) between the materials. The strain mismatch, $\epsilon$, can be broken into two dominant components; the thermal mismatch resulting from built-in strain ($\epsilon_{bi}$) and the difference between the coefficients of thermal expansion ($\alpha$) of the materials. Thus, the mismatch strain in the system can be described by the equation:

$$\epsilon = (\alpha_1 - \alpha_2)\Delta T + \epsilon_{bi}$$

where $\Delta T$ is the difference between room temperature and the process temperature. In many embodiments, $\Delta T$ is fixed by the process such that preventing bowing becomes a function of minimizing the intrinsic stresses and differences in the CTE of the carrier substrate and the flexible substrates.

Referring back to FIG. 1, in some embodiments, method 100 can comprise procedure 155 of forming the electronic devices over the first flexible substrate. In many embodiments, the scale of method 100 is not limited to geometry or size of tools for processing. In some examples, dry etching can be used when forming the electronic devices over the first flexible substrate. In other examples, wet chemistries can be used when forming the electronic devices over the first flexible substrate. In the same or different examples, the wet chemistries can comprise a buffered oxide etch (BOE). In some examples, forming the electronic devices over the first flexible substrate can comprise using a metal-ion-free (MIF) developer to strip the photoresist. In some examples, forming the electronic devices over the first flexible substrate can comprise using a metal-ion-free (MIF) developer to strip the photoresist. In the same or different examples, forming the electronic devices over the first flexible substrate can comprise applying surfactant to the first flexible substrate and the second flexible substrate. In many embodiments, the dual substrate assembly can sustain its aforementioned bond integrity throughout the entirety of procedure 155.

Referring back to FIG. 1, in some embodiments, method 100 can comprise procedure 160 of debonding the first flexible substrate with the electronic devices from the carrier substrate. In many examples, procedure 160 of debonding the first flexible substrate can provide a clean separation from the carrier substrate so as not to damage or degrade the performance of the electronic devices of the first flexible substrate.

In many embodiments, debonding the first flexible substrate with the electronic devices from the carrier substrate comprises curing the first adhesive with ultraviolet radiation. In other embodiments, debonding the first flexible substrate with the electronic devices from the carrier substrate comprises crosslinking the first adhesive. In further embodiments, debonding the first flexible substrate with the electronic devices from the carrier substrate comprises curing the first adhesive with ultraviolet radiation and crosslinking the first adhesive.

In various embodiments, debonding the first flexible substrate with the electronic devices from the carrier substrate comprises applying a solvent to the first adhesive. In some examples, applying a solvent to the first adhesive can require extended debonding time due to the solvent diffusion limitations based upon the limited area of the first adhesive between the carrier substrate and the first flexible substrate that is exposed to the solvent.

In some embodiments, debonding the first flexible substrate with the electronic devices from the carrier substrate comprises heating the carrier substrate to induce a requisite reduction in adhesion force, typically by decomposition of the first adhesive. In some embodiments, debonding the first flexible substrate with the electronic devices from the carrier substrate comprises performing laser ablation of the adhesive to cause thermal decomposition of the polymer as the laser energy is converted to heat. In some embodiments, debonding the first flexible substrate with the electronic devices from the carrier substrate comprises performing a backside excimer laser-induced release by melting or ablating a thin polymer layer at the interface of the carrier substrate and the first flexible substrate.

In some embodiments, debonding the first flexible substrate with the electronic devices from the carrier substrate comprises mechanically debonding the first flexible substrate from the carrier substrate using a thin wire or blade. In some embodiments, the wire can be thin enough and/or the first adhesive can be thick enough so that a wire can pass in between the carrier substrate and the first flexible substrate.

Figure 8:
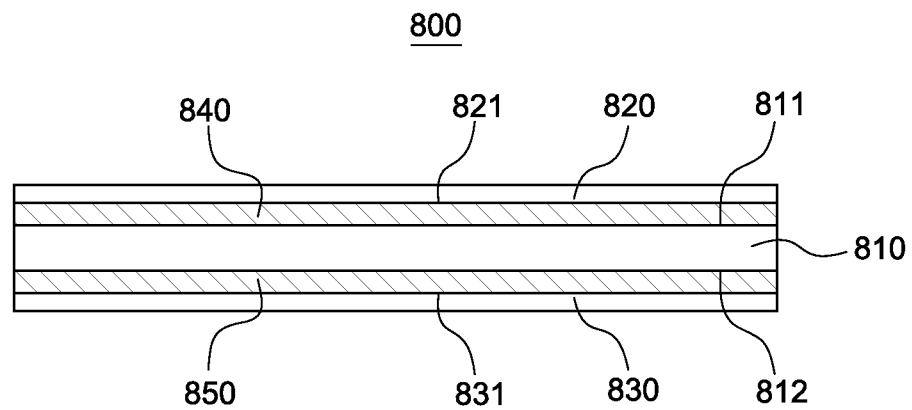
FIG. 8 illustrates a cross-sectional view of an example of a structure, according to the first embodiment.

Referring back to the figures, FIG. 8 illustrates a cross-sectional view of an example structure 800, according to the first embodiment. Structure 800 can be similar to the composite substrate described earlier with respect to FIGS. 1-7. For example, in many embodiments, structure 800 can comprise carrier substrate 810 having first side 811 and second side 812. In various embodiments, structure 800 can comprise first flexible substrate 820 having first carrier side 821. In the same embodiments, structure 800 can comprise second flexible substrate 830 having second carrier side 831. In some embodiments, first side 811 of carrier substrate 810 is bonded to first carrier side 821, and second side 812 of carrier substrate 810 is bonded to second carrier side 831.

In further embodiments, first flexible substrate 820 and second flexible substrate 830 comprise a thermoplastic polymer. In many embodiments, the thermoplastic polymers comprise at least one of polyethylene naphthalate, polyethylene terephthalate, polyethersulfone, polyimide, polycarbonate, cyclic olefin copolymer, or liquid crystal polymer. In some embodiments, first flexible substrate 820 and second flexible substrate 830 comprise a thickness greater than 3 micrometers and less than 100 micrometers.

In some embodiments, carrier substrate 810 comprises a material having a glass transition point greater than or equal to approximately 300° C. In other embodiments, the material comprises at least one of alumina ($Al_2O_3$), silicon, steel, sapphire, barium borosilicate, soda lime silicate, or alkali silicate. In various embodiments, carrier substrate 810 comprises a thickness greater than or equal to approximately 0.5 millimeters and less than or equal to approximately 2.0 millimeters.

In various embodiments, structure 800 further comprises first adhesive 840 and second adhesive 850. In the same or different embodiments, first adhesive 840 and/or second adhesive 850 comprise a cross-linking adhesive and/or a thickness greater than or equal to approximately 3 micrometers and less than or equal to approximately 50 micrometers. In further embodiments, first adhesive 840 and/or second adhesive 850 comprise a pressure sensitive adhesive and/or a thickness greater than or equal to approximately 3 micrometers and less than or equal to approximately 250 micrometers.

In many embodiments, first flexible substrate 820 creates a first force acting on carrier substrate 810. In the same or different embodiments, second flexible substrate 830 creates a second force acting on carrier substrate 810. In many embodiments, the second force compensates for the first force. In some embodiments, the second force compensates for a majority of the first force. In other embodiments, the second force compensates for a minority of the first force.

In many embodiments, while first flexible substrate 820 is bonded to carrier substrate 810, first flexible substrate 820 comprises a first variation in flatness. In the same or different embodiments, while second flexible substrate 830 is bonded to carrier substrate 810, second flexible substrate 830 comprises a second variation in flatness. In many embodiments, each of the first variation in flatness and the second variation in flatness are substantially zero. In various embodiments, the first variation in flatness and the second variation in flatness can be the same. In other embodiments, the first variation in flatness and the second variation in flatness can be different.

Figure 9:
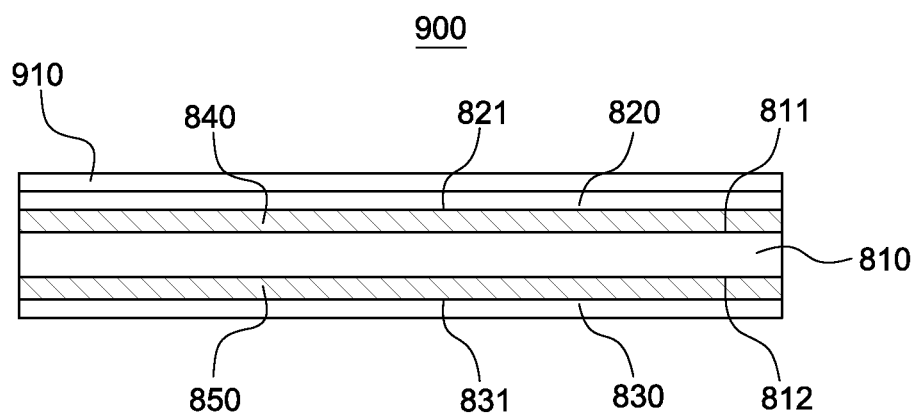
FIG. 9 illustrates a cross-sectional view of an example of electronic devices formed on a structure, according to the first embodiment.

FIG. 9 illustrates an example of structure 900, which compromises structure 800 (FIG. 8) after performing procedure 155 of method 100 (FIG. 1), according to the first embodiment. In many embodiments, structure 900 of FIG. 9 comprises electronic device layer 910. In some embodiments, the electronic devices can be semiconductor devices. In some embodiments, the electronic devices can be electrophoretic displays. In other embodiments, the electronic devices can be TFTs. In many embodiments, similar processing conditions can be utilized to fabricate TFT arrays on bonded flexible substrates and traditional rigid silicon wafers.

Figure 10:
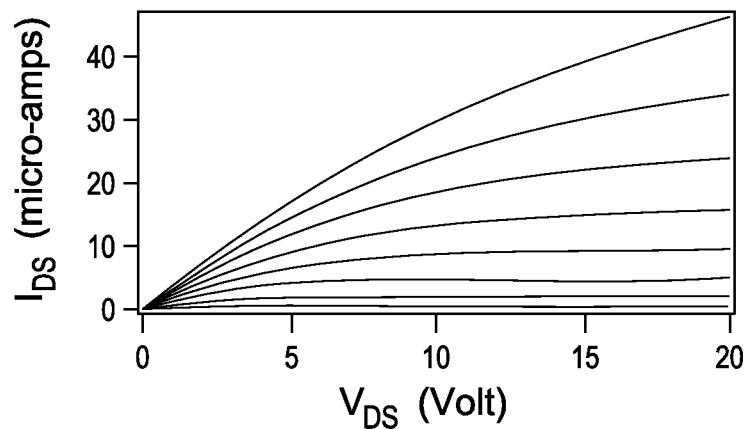
FIG. 10 provides exemplary current-voltage transfer characteristics for a typical test thin-film transistor fabricated on heat stabilized polyethylene naphthalate first flexible substrate using a 180° C. hydrogenated amorphous silicon process, the gate steps from −5 volts to 20 volts, provided according to the first embodiment.
Figure 11:
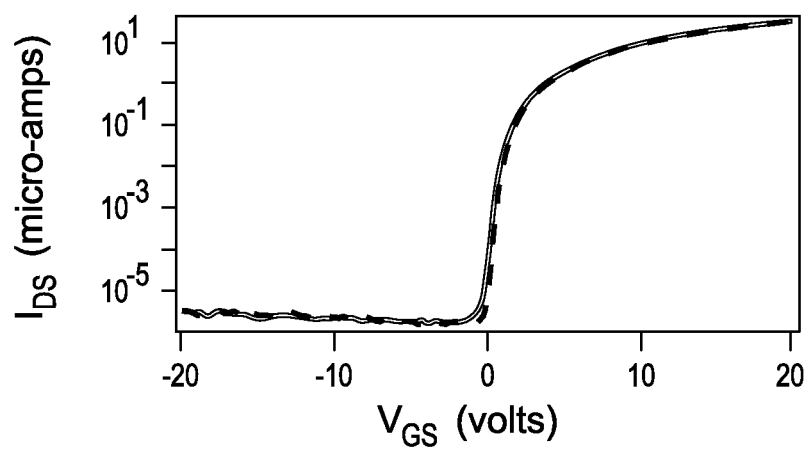
FIG. 11 provides an exemplary hysteresis curve for a gate voltage sweep from −20 volts to 20 volts, with a drain voltage fixed at 10 volts and exhibiting a very low hysteresis of <0.12 volts, for a thin-film transistor provided according to the first embodiment.

For example, 32 individual test transistors with 96 μm channel width (W) and 9 μm channel length (L) where (W/L=10.67) were distributed at different locations on a 150 mm wafer were formed on a structure similar to structure 900 of FIG. 9. The electrical performance of the test transistors was assessed by examining the parameters of effective saturation mobility ($\mu_{sat}$), threshold voltage ($V_t$), drive current ($I_{drive}$), and hysteresis. FIG. 10 shows the current voltage transfer characteristics for one of the TFTs formed on heat stabilized PEN (HS-PEN) according to method 100. The drain current as a function of drain voltage ($I_{ds}$-$V_{ds}$) measurement runs a 0 volts (V) to 20 V sweep on the drain with each gate step, which varies from −5 V to 20 V. FIG. 11 shows the hysteresis for a gate voltage sweep from −20 V to 20 V at a fixed drain voltage of 10 V for the same TFT. The performance of the TFT shown in FIG. 10 and FIG. 11 exhibits a mean saturation mobility of 0.84 cm$^2$/V-second (V-sec), threshold voltage of 0.66 V, sub-threshold slope of 0.38, a sub and an on/off ratio of greater than 10$^9$. Other TFTs could exhibit on/off ratios greater than 10$^6$ or 10$^8$. The device performance is predictable as there is very low hysteresis (less than 0.12 V) in current-voltage trace and retrace measurements. These properties are consistent with the average properties for TFTs fabricated on HS-PEN based on several lots consisting of eight wafers as shown in Table 1.

TABLE 1

| Parameter | Rigid Silicon | HS-PEN | Stainless Steel |
| --- | --- | --- | --- |
| Saturation Mobility (cm2/V-sec) | 0.91 ± 0.37 | 0.77 ± 0.08 | 0.79 ± 0.04 |
| Threshold Voltage (V) | 0.32 ± 0.28 | 0.49 ± 0.28 | 0.43 ± 0.24 |
| Drive Current (μA) | 23 ± 8.8 | 27 ± 2.2 | 24 ± 2.5 |

Additionally, these average performance metrics for hydrogenated amorphous silicon (a-Si:H) TFTs fabricated on bonded HS-PEN can be compared with those fabricated on bonded stainless steel (SS) and rigid silicon using an identical baseline TFT process. The performance of TFTs on HS-PEN and SS are equivalent to those fabricated on rigid silicon.

Figure 12:
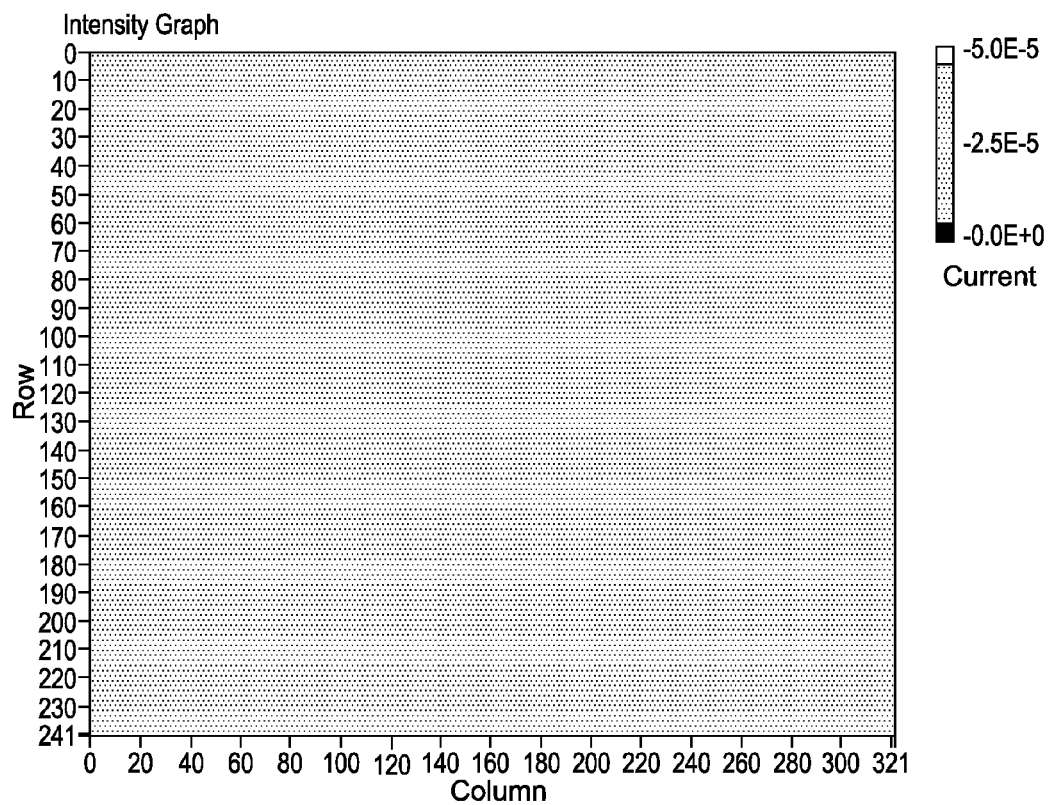
FIG. 12 provides an exemplary thin-film transistor array drive current map and histogram for a rigid silicon first flexible substrate.
Figure 12:
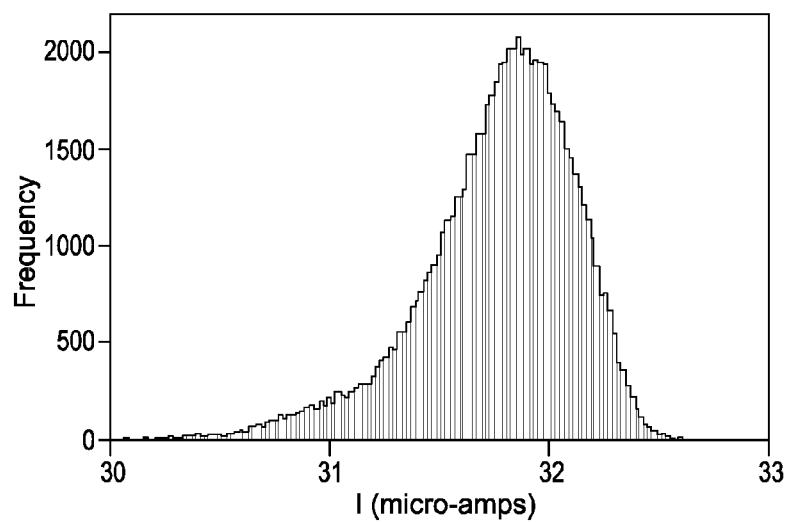
Figure 13:
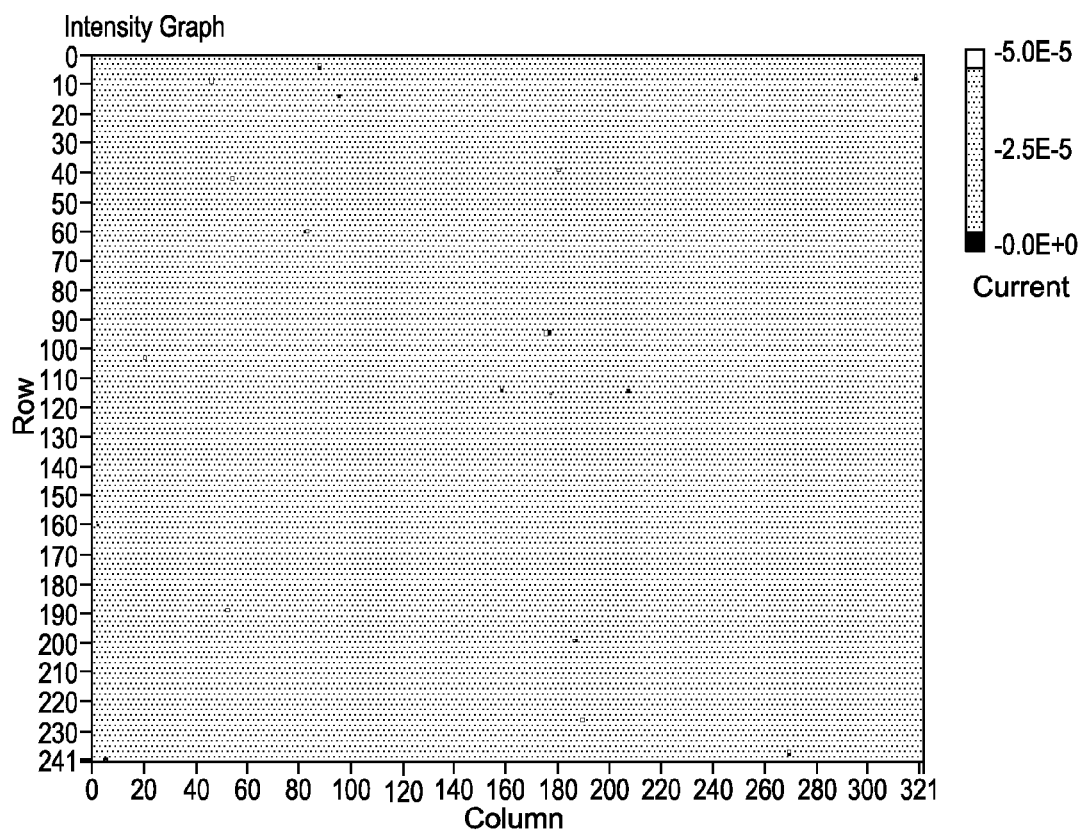
FIG. 13 provides an exemplary thin-film transistor array drive current map and histogram for a heat stabilized polyethylene naphthalate first flexible substrate, provided according to the first embodiment.
Figure 13:
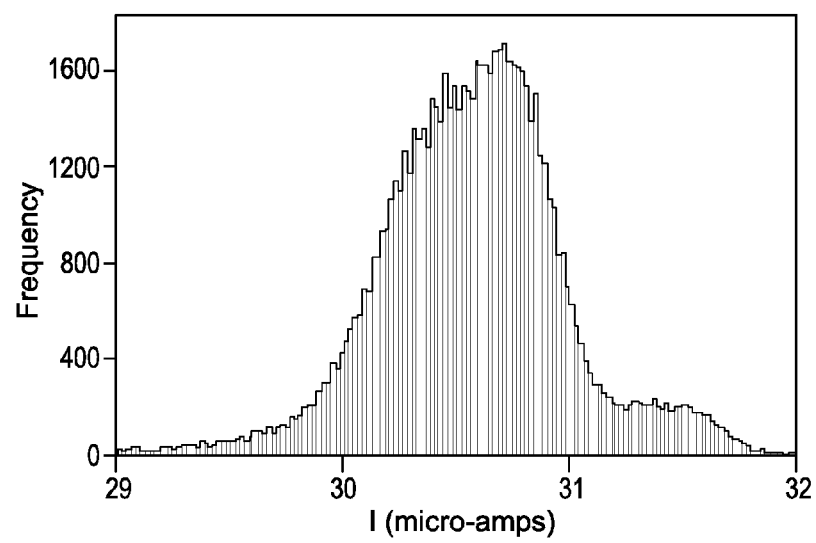
Figure 14:
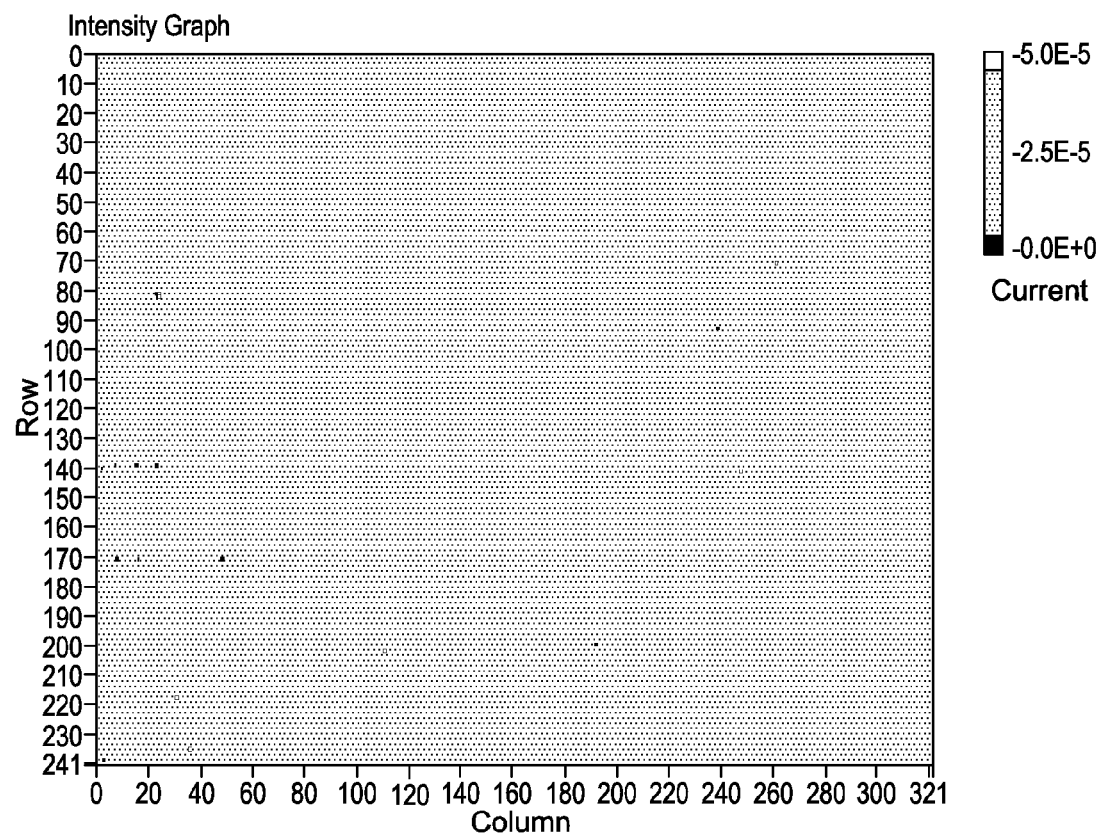
FIG. 14 provides an exemplary thin-film transistor array drive current map and histogram for a planarized stainless steel first flexible substrate, provided according to the first embodiment.
Figure 14:
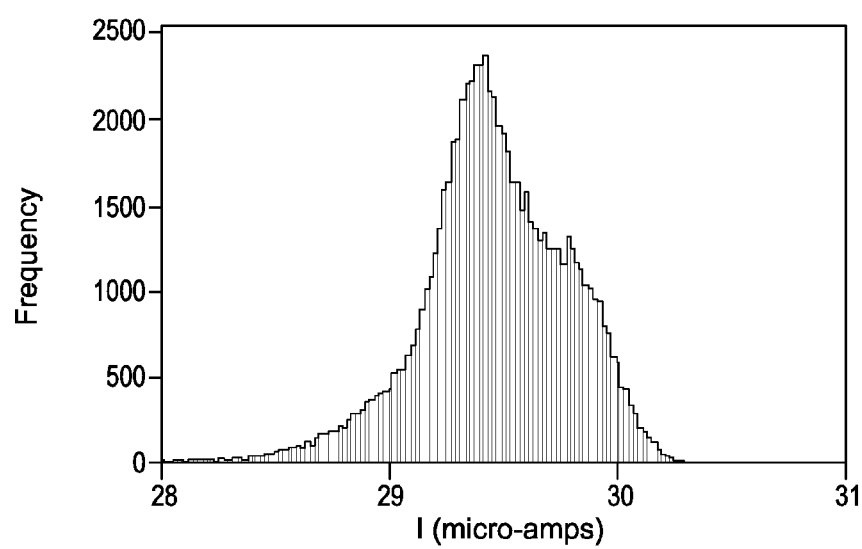

For full TFT array characterization, each TFT in the array was tested at a relevant condition for an active matrix backplane. The array map data used a probe needle to bias each individual pixel capacitor to −20 V (corresponding to a bias of +20 V on both the gate and drain) and the current passing through the transistor is measured. The mean drive current for a pixel is approximately 25 microAmpere (μA). This average performance was utilized as a reference to assess shorts (TFT has greater than double mean current) and open (TFT current is less than 5 μA) pixels. FIGS. 12-14 illustrate a TFT array drive current test map for a quarter video graphics array (QVGA) fabricated on HS-PEN, SS, and silicon substrates. The shorts are represented by square white dots and opens by square black dots. For TFT arrays fabricated on silicon, there are no apparent shorts and opens in the array map as shown in FIG. 12. Fabrication on TFT arrays on HS-PEN or SS using method 100 did not adversely impact the manufacturing yield. A typical array contains 6 to 10 defects (opens and shorts) as illustrated in FIG. 13 and FIG. 14. Additionally, the drive current histograms are shown to the right of each array map in FIGS. 12-14. An ideal, defect-free histogram for an array map is a narrow, normal distribution. The defects are detected in histograms as a skew in distribution or multiple peaks.

Figure 15:
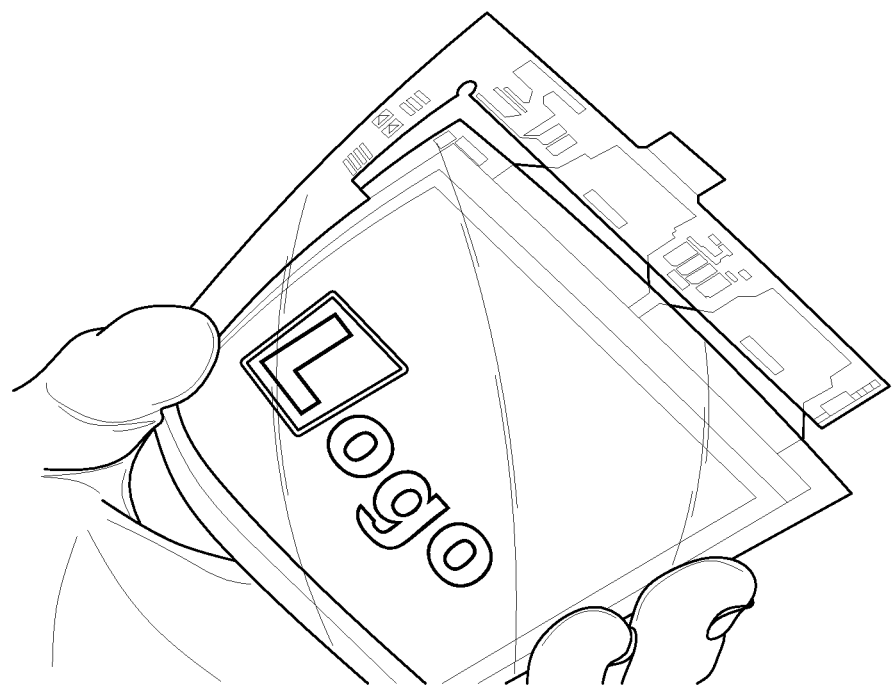
FIG. 15 shows an exemplary electrophoretic display that is built on a heat stabilized polyethylene naphthalate first flexible substrate, provided according to the first embodiment.

FIG. 15 shows electrophoretic displays (EPDs) that utilize TFT backplanes fabricated on plastic substrates, according to method 100. For this example, the pixel pitch is 240 μm and the supply voltage is about 10 V for the TFT backplane. The electrophoretic frontplane (E-Ink) was integrated to a debonded TFT backplane to produce a 320×240 pixel (3.8 inch diagonal) display. The display shows there are only three rows and column lineouts for the HE-PEN substrate. The display exhibits good contrast ratio and gray scale (4-bit) and fast image switching speed (about 0.35 seconds). Similar results were found for various examples employing SS foils for the first flexible substrate.

Figure 16:
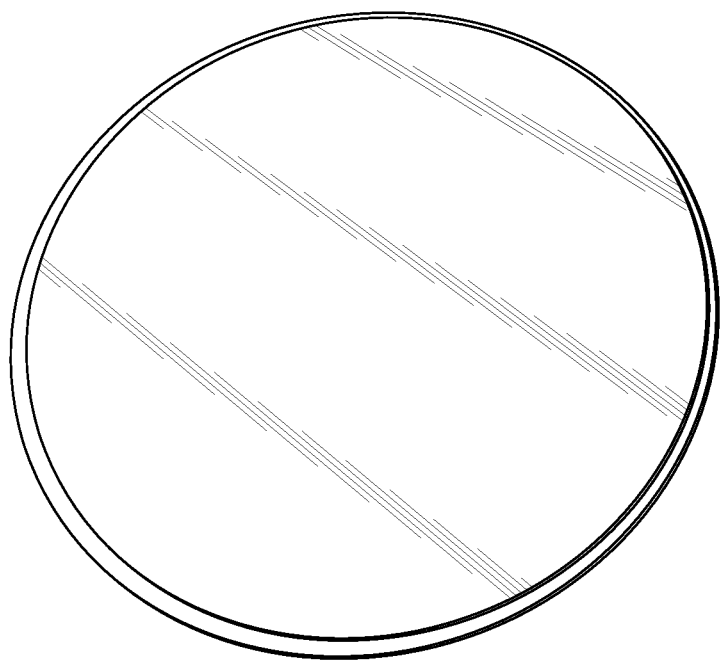
FIG. 16 shows an exemplary structure having a heat stabilized polyethylene naphthalate first flexible substrate bonded to the carrier substrate prior to thin-film transistor fabrication, provided according to the first embodiment.
Figure 17:
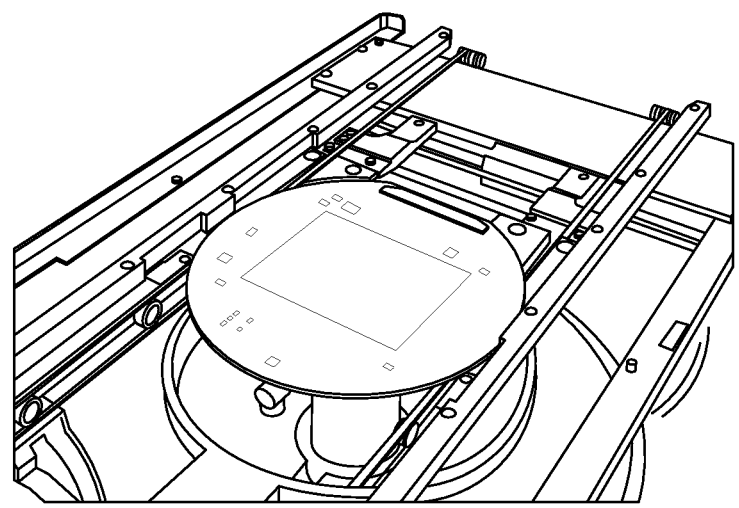
FIG. 17 shows an exemplary structure having a heat stabilized polyethylene naphthalate first flexible substrate bonded to the carrier substrate while undergoing processing by an automated photoresist coater tool, according to the first embodiment.
Figure 18:
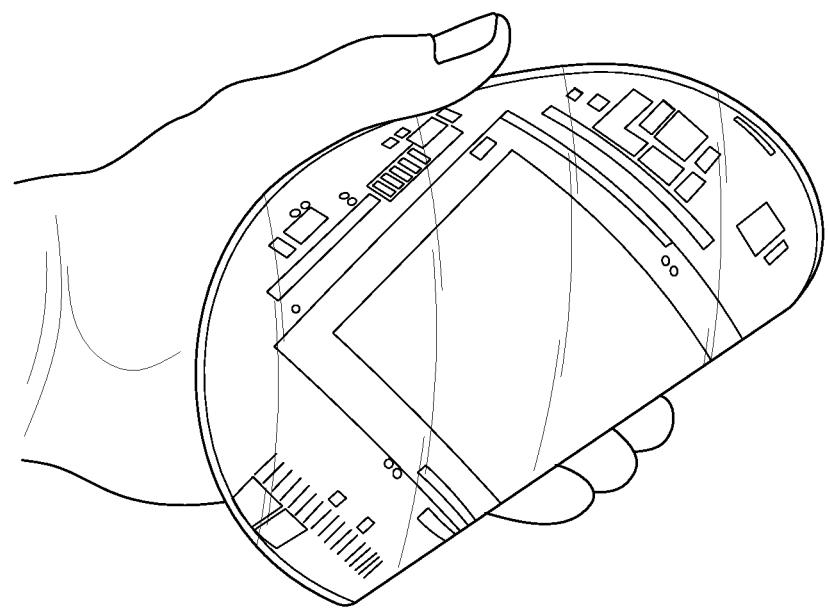
FIG. 18 shows an exemplary structure having a heat stabilized polyethylene naphthalate first flexible substrate after process completion and debonding, according to the first embodiment.

Returning to the figures, FIGS. 16-18 provide images of the dual substrate assembly at various different stages of processing, according to the first embodiment. FIG. 16 provides an image of the dual substrate assembly prior to forming electronic devices over the first flexible substrate. FIG. 17 provides an image of the dual substrate assembly while undergoing processing by an automated photoresist coater tool to form a TFT on the first flexible substrate. In some embodiments, the ability to utilize automated tools can improve yield and decrease device to device variability. FIG. 18 provides an image showing the first flexible substrate with a TFT after debonding the first flexible substrate from the carrier substrate.

Figure 19:
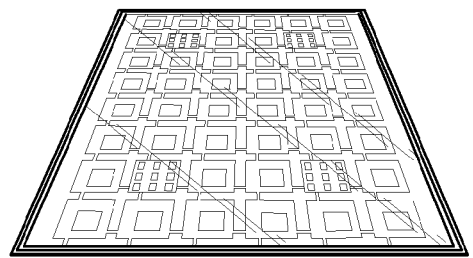
FIG. 19 shows a GEN II size heat stabilized polyethylene naphthalate first flexible substrate after active stack deposition and patterning, bonded to a glass carrier substrate, according to the first embodiment.
Figure 20:
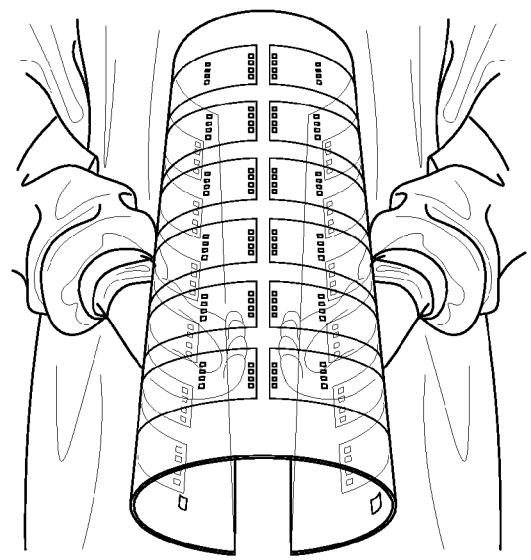
FIG. 20 shows a debonded GEN II size heat stabilized naphthalate first flexible substrate after metal deposition and patterning, according to the first embodiment.

FIG. 19 and FIG. 20 provide images of dual substrate assemblies scaled up with a first flexible substrate comprising GEN II size (370 mm×470 mm) HS-PEN. FIG. 19 shows the HS-PEN first flexible substrate after active stack deposition and patterning. In many embodiments, the first flexible substrate can be processed using automated TFT fabrication tools. FIG. 20 shows the first flexible substrate after debonding from the carrier substrate.

Figure 21:
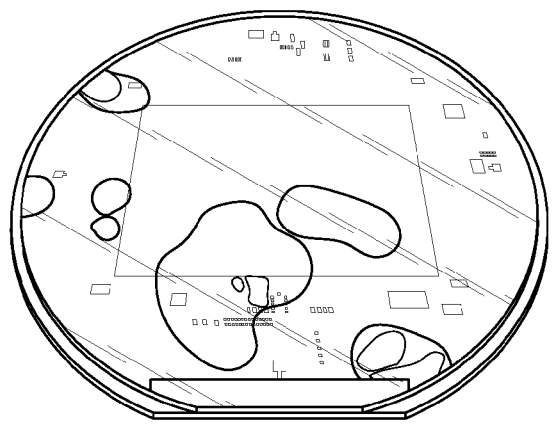
FIG. 21 shows a heat stabilizing polyethylene naphthalate first flexible substrate bonded to a silicon wafer where the substrate has undergone catastrophic blistering.

In some embodiments, where attempting to bond flexible substrates to a carrier substrate by a method other than method 100, one of two major failure modes can occur leading to degradation in process performance. The first common failure mode is blistering of the adhesive, as illustrated in the image of FIG. 21. The blistering in FIG. 21 occurred during plasma enhanced chemical vapor deposition (PECVD) of a a-Si:H semiconductor channel layer. Blistering tends to occur preferentially at particle-defect and bubble-defect sites within the adhesive. Blistering is further exacerbated by outgassing of the adhesive during thermal and/or vacuum processing steps. The second common failure mode is excessive bending of the dual substrate assembly caused by bowing, as described above.

In various embodiments, method 100 (FIG. 1) and structures 800 and 900 (FIGS. 8 and 9) could be used for at least paper-like electronic newspapers, cell phones, large area radio frequency communication devices, wearable electronics, low-cost photovoltaic cells, sensors, structural health monitors, conformal x-ray imagers, artificial muscles, biological tissues, and radio-frequency identification (RFID) tags, among other uses. In further embodiments, method 100 and structures 800 and 900 could be used for flexible flat panel display manufacturing, flexible semiconductor manufacturing, flexible electronic manufacturing/processing, flexible solar manufacturing, and flexible sensor manufacturing.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that activities 310, 320, and 330 of FIG. 3, processes 210, 220, and 230 of FIG. 2, processes 410, 420, and 430 of FIG. 4, processes 510, 520, 530, and 550 of FIG. 5, processes 610, 620, and 630 of FIG. 6, processes 710, 720, 730, and 750 of FIG. 7 and procedures 110, 115, 120, 125, 130, 135, 140, 145, 149, 150, 155, and 160 of FIG. 1 may be comprised of many different activities, procedures and processes, and can be performed by many different modules, in many different orders, that any element of FIGS. 1-9 may be modified, and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are expressly stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing electronic devices, the method comprising:
providing a carrier substrate having a first side and a second side;
providing a first flexible substrate;
bonding the first flexible substrate to the first side of the carrier substrate with a first adhesive; and
compensating for a deformation of the carrier substrate by coupling a mechanism to the second side of the carrier substrate, the deformation being caused by the bonding the first flexible substrate to the first side of the carrier substrate.

2. The method of claim 1 further comprising:
providing a second flexible substrate; and
wherein:
compensating for the deformation of the carrier substrate by coupling the mechanism to the second side of the carrier substrate comprises bonding the second flexible substrate to the second side of the carrier substrate with a second adhesive; and
the mechanism comprises the second flexible substrate.

3. The method of claim 2 wherein at least one of:
the first flexible substrate comprises a thermoplastic polymer, and the second flexible substrate comprises the thermoplastic polymer;
the first adhesive comprises an adhesive material, and the second adhesive comprises the adhesive material; or
the carrier substrate comprises at least one of alumina, silicon, steel, sapphire, barium borosilicate, soda lime silicate, or alkali silicate.

4. The method of claim 2 wherein:
each of the first flexible substrate and the second flexible substrate comprises a thermoplastic polymer comprising at least one of polyethylene naphthalate, polyethylene terephthalate, polyethersulfone, polyimide, polycarbonate, cyclic olefin copolymer, or liquid crystal polymer.

5. The method of claim 2 wherein:
the carrier substrate comprises at least one of alumina, steel, sapphire, barium borosilicate, soda lime silicate, or alkali silicate.

6. The method of claim 2 wherein:
each of the first flexible substrate and the second flexible substrate comprises a thermoplastic polymer comprising at least one of polyethylene naphthalate, polyethylene terephthalate, polyethersulfone, polyimide, polycarbonate, cyclic olefin copolymer, or liquid crystal polymer; and
the carrier substrate comprises at least one of alumina, silicon, steel, sapphire, barium borosilicate, soda lime silicate, or alkali silicate.

7. The method of claim 1 further comprising:
forming the electronic devices over the first flexible substrate.

8. The method of claim 7 further comprising:
debonding the first flexible substrate with the electronic devices from the carrier substrate.

9. The method of claim 8 wherein:
debonding the first flexible substrate with the electronic devices comprises at least one of:
curing the first adhesive with at least one of ultraviolet radiation or thermal radiation; or
crosslinking the first adhesive.

10. A method of manufacturing electronic devices, the method comprising:
providing a carrier substrate having a first side and a second side;
providing a first flexible substrate having a first outer side and a first carrier side;
providing a second flexible substrate having a second outer side and a second carrier side;
providing a first adhesive;
providing a second adhesive;
applying a first protective layer to the first outer side;
bonding the first carrier side of the first flexible substrate to the first side of the carrier substrate, wherein the first adhesive bonds the first carrier side of the first flexible substrate to the first side of the carrier substrate;
curing the first adhesive;
applying a second protective layer to the second outer side;
bonding the second carrier side of the second flexible substrate to the second side of the carrier substrate, wherein the second adhesive bonds the second carrier side of the second flexible substrate to the second side of the carrier substrate;
curing the second adhesive;
removing the first protective layer from the first outer side;
removing the second protective layer from the second outer side;
baking the first flexible substrate, the second flexible substrate, and the carrier substrate; and
providing a barrier layer at one or more of the first flexible substrate or the second flexible substrate;
wherein:
bonding the second carrier side of the second flexible substrate to the second side of the carrier substrate comprises compensating for a deforming force acting on the carrier substrate by the first flexible substrate resulting from the bonding the first carrier side of the first flexible substrate to the first side of the carrier substrate.

11. The method of claim 10 further comprising at least one of:
baking the first flexible substrate in a vacuum, and baking the second flexible substrate in the vacuum;
treating the first side of the carrier substrate to remove defects, and treating the second side of the carrier substrate to remove defects; or configuring the first side of the carrier substrate with a first single micrometer roughness, and configuring the second side of the carrier substrate with a second single micrometer roughness.

12. The method of claim 10 wherein at least one of:
each of the first flexible substrate and the second flexible substrate comprises a thermoplastic polymer comprising at least one of polyethylene naphthalate, polyethylene terephthalate, polyethersulfone, polyimide, polycarbonate, cyclic olefin copolymer, or liquid crystal polymer;
each of the first flexible substrate and the second flexible substrate comprises a substrate thickness greater than or equal to approximately 3 micrometers and less than or equal to approximately 100 micrometers;
the carrier substrate comprises a carrier material having a glass transition point greater than or equal to approximately 300° C.;
the carrier substrate comprises a carrier thickness greater than or equal to approximately 0.5 millimeters and less than or equal to approximately 2.0 millimeters;
each of the first protective layer and the second protective layer comprises tape; or
the barrier layer comprises at least one of silicon nitride or silicon dioxide.

13. The method of claim 10 wherein:
providing the first adhesive comprises:
selecting the first adhesive; and
applying the first adhesive;
and
providing the second adhesive comprises:
selecting the second adhesive; and
applying the second adhesive;
wherein:
each of applying the first adhesive and applying the second adhesive comprises at least one of spin-coating, spray-coating, extrusion-coating, preform laminating, slot die coating, screen laminating, or screen printing.

14. The method of claim 10 wherein at least one of:
each of the first adhesive and the second adhesive comprises one of: (a) a cross-linking adhesive or (b) a pressure sensitive adhesive; or
each of the first adhesive and the second adhesive comprises a thickness greater than or equal to 3 micrometers and less than or equal to 50 micrometers.

15. The method of claim 10 wherein:
bonding the first carrier side of the first flexible substrate to the first side of the carrier substrate comprises roll pressing the first carrier side of the first flexible substrate to the first side of the carrier substrate; and
roll pressing the first carrier side of the first flexible substrate occurs at a condition comprising at least one of:
a pressure greater than or equal to approximately 5 pounds per square inch and less than or equal to approximately 60 pounds per square inch;
a temperature greater than or equal to approximately 30° C. and less than or equal to approximately 100° C.; or
a feed rate greater than or equal to approximately 0.25 meters per minute and less than or equal to approximately 1 meter per minute.

16. The method of claim 10 wherein:
the first flexible substrate comprises polyethylene terephthalate; and
baking the first flexible substrate, the second flexible substrate, and the carrier substrate occurs at a condition comprising at least one of:
a vacuum;
a pressure of approximately 30 milliTorr;
a temperature of approximately 150° C.; or
a time of approximately 1 hour.

17. The method of claim 10 wherein:
the first flexible substrate comprises polyethylene naphthalate; and
baking the first flexible substrate, the second flexible substrate, and the carrier substrate occurs at a condition comprising at least one of:
a vacuum;
a pressure of approximately 30 milliTorr;
a temperature of approximately 200° C.; or
a time of approximately 1 hour.

18. The method of claim 10 wherein:
after bonding the first carrier side of the first flexible substrate to the first side of the carrier substrate and after bonding the second carrier side of the second flexible substrate to the second side of the carrier substrate, the first flexible substrate comprises a first variation in flatness and the second flexible substrate comprises a second variation in flatness equal to the first variation in flatness.

19. The method of claim 18 wherein:
the first variation in flatness and the second variation in flatness are substantially zero.

20. The method of claim 18 wherein:
each of the first flexible substrate and the second flexible substrate comprises a thermoplastic polymer comprising at least one of polyethylene naphthalate, polyethylene terephthalate, polyethersulfone, polyimide, polycarbonate, cyclic olefin copolymer, or liquid crystal polymer.

* * * * *